US007138832B2

(12) United States Patent
Bertin et al.

(10) Patent No.: US 7,138,832 B2
(45) Date of Patent: Nov. 21, 2006

(54) NANOTUBE-BASED SWITCHING ELEMENTS AND LOGIC CIRCUITS

(75) Inventors: Claude L. Bertin, South Burlington, VT (US); Thomas Rueckes, Boston, MA (US); Brent M. Segal, Woburn, MA (US)

(73) Assignee: Nantero, Inc., Woburn, MA (US)

( * ) Notice: Subject to any disclaimer, the term of this patent is extended or adjusted under 35 U.S.C. 154(b) by 108 days.

(21) Appl. No.: 10/917,893

(22) Filed: Aug. 13, 2004

(65) Prior Publication Data
US 2005/0035787 A1 Feb. 17, 2005

Related U.S. Application Data

(60) Provisional application No. 60/494,889, filed on Aug. 13, 2003.

(51) Int. Cl.
*H03K 19/20* (2006.01)
(52) U.S. Cl. .................. 326/104; 977/932; 977/940
(58) Field of Classification Search ................. 326/104
See application file for complete search history.

(56) References Cited

U.S. PATENT DOCUMENTS 4,853,893 A    8/1989   Eaton et al.

(Continued)

FOREIGN PATENT DOCUMENTS

WO      WO 01/03208      1/2001

(Continued)

OTHER PUBLICATIONS

Homma, Y., et al., "Growth of suspended carbon nanotube networks on 100-nm-scale silicon pillars," App. Physics Lett., 2002, vol. 81(12), pp. 2261-2263.

(Continued)

*Primary Examiner*—Vibol Tan
(74) *Attorney, Agent, or Firm*—Wilmer Cutler Pickering Hale and Dorr LLP

(57) ABSTRACT

Nanotube-based switching elements and logic circuits. Under one embodiment of the invention, a switching element includes an input node, an output node, a nanotube channel element having at least one electrically conductive nanotube, and a control electrode. The control electrode is disposed in relation to the nanotube channel element to controllably form an electrically conductive channel between the input node and the output node. The channel at least includes said nanotube channel element. The output node is constructed and arranged so that channel formation is substantially unaffected by the electrical state of the output node. Under another embodiment of the invention, the control electrode is arranged in relation to the nanotube channel element to form said conductive channel by causing electromechanical deflection of said nanotube channel element. Under another embodiment of the invention, the output node includes an isolation structure disposed in relation to the nanotube channel element so that channel formation is substantially invariant from the state of the output node. Under another embodiment of the invention, the isolation structure includes electrodes disposed on opposite sides of the nanotube channel element and said electrodes produce substantially the same electric field. Under another embodiment of the invention, a Boolean logic circuit includes at least one input terminal and an output terminal, and a network of nanotube switching elements electrically disposed between said at least one input terminal and said output terminal. The network of nanotube switching elements effectuates a Boolean function transformation of Boolean signals on said at least one input terminal. The Boolean function transformation includes a Boolean inversion within the function, such as a NOT or NOR function.

18 Claims, 18 Drawing Sheets

U.S. PATENT DOCUMENTS

| | | | |
|---|---|---|---|
| 4,979,149 | A | 12/1990 | Popovic et al. |
| 5,903,010 | A | 5/1999 | Flory et al. |
| 6,128,214 | A | 10/2000 | Kuekes et al. |
| 6,198,655 | B1 | 3/2001 | Heath et al. |
| 6,232,706 | B1 | 5/2001 | Dai et al. |
| 6,348,700 | B1 | 2/2002 | Ellenbogen et al. |
| 6,445,006 | B1 | 9/2002 | Brandes et al. |
| 6,518,156 | B1 | 2/2003 | Chen et al. |
| 6,548,841 | B1 | 4/2003 | Frazier et al. |
| 6,559,468 | B1 | 5/2003 | Kuekes et al. |
| 6,574,130 | B1 | 6/2003 | Segal et al. |
| 6,643,165 | B1 | 11/2003 | Segal et al. |
| 6,673,424 | B1 | 1/2004 | Lindsay et al. |
| 6,706,402 | B1 | 3/2004 | Rueckes et al. |
| 6,750,471 | B1 | 6/2004 | Bethune et al. |
| 6,759,693 | B1 | 7/2004 | Vogeli et al. |
| 6,760,245 | B1 | 7/2004 | Eaton, Jr. et al. |
| 6,774,052 | B1 | 8/2004 | Vogeli et al. |
| 6,781,166 | B1 | 8/2004 | Lieber et al. |
| 6,784,028 | B1 | 8/2004 | Rueckes et al. |
| 6,803,840 | B1 | 10/2004 | Hunt et al. |
| 6,809,465 | B1 | 10/2004 | Jin |
| 6,835,591 | B1 | 12/2004 | Rueckes et al. |
| 6,836,424 | B1 | 12/2004 | Segal et al. |
| 6,919,740 | B1 * | 7/2005 | Snider .................. 326/134 |
| 2001/0023986 | A1 | 9/2001 | Mancevsk |
| 2002/0130353 | A1 | 9/2002 | Lieber et al. |
| 2002/0172963 | A1 | 11/2002 | Kelley et al. |
| 2002/0175390 | A1 | 11/2002 | Goldstein et al. |
| 2002/0179434 | A1 | 12/2002 | Dai et al. |
| 2003/0021966 | A1 | 1/2003 | Segal et al. |
| 2003/0124325 | A1 | 7/2003 | Rueckes et al. |
| 2003/0165074 | A1 | 9/2003 | Segal et al. |
| 2003/0379973 | | 9/2003 | Segal et al. |
| 2003/0200521 | A1 * | 10/2003 | DeHon et al. ............. 716/16 |
| 2003/0234407 | A1 | 12/2003 | Vogeli et al. |
| 2003/0236000 | A1 | 12/2003 | Vogeli et al. |
| 2004/0085805 | A1 | 5/2004 | Segal et al. |
| 2004/0146289 | A1 | 7/2004 | Rueckes et al. |
| 2004/0159833 | A1 | 8/2004 | Rueckes et al. |
| 2004/0175856 | A1 | 9/2004 | Jaiprakash et al. |
| 2004/0181630 | A1 | 9/2004 | Jaiprakash et al. |
| 2004/0191978 | A1 | 9/2004 | Rueckes et al. |
| 2004/0213466 | A1 | 10/2004 | Rueckes et al. |
| 2004/0214366 | A1 | 10/2004 | Segal et al. |
| 2004/0214367 | A1 | 10/2004 | Segal et al. |
| 2005/0035344 | A1 | 2/2005 | Bertin et al. |
| 2005/0035367 | A1 | 2/2005 | Bertin et al. |
| 2005/0035786 | A1 | 2/2005 | Bertin et al. |
| 2005/0036365 | A1 | 2/2005 | Bertin et al. |
| 2005/0037547 | A1 | 2/2005 | Bertin et al. |

FOREIGN PATENT DOCUMENTS

| | | |
|---|---|---|
| WO | WO/01/44796 A1 | 6/2001 |
| WO | WO 03/091486 A1 | 11/2003 |
| WO | WO 04/065655 A1 | 8/2004 |
| WO | WO 04/065657 A1 | 8/2004 |
| WO | WO 04/065671 A1 | 8/2004 |

OTHER PUBLICATIONS

Poncharal, P., "Electrostatic Deflections and Electromechanical Resonances of Carbon Nanotubes," Science, 1999, vol. 283, pp. 1513-1516.

Rueckes, et al., "Carbon Nanotube-Based Nonvolatile Random Access Memory for Molecular Computing," Science, 2000, vol. 289, pp. 94-97.

Chen, et al. "Noncovalent Sidewall Functionalization of Single-Walled Carbon Nanotubes for Protein Immobilization," J. Am. Chem. Soc., 2001, vol. 123, pp. 3838-3839.

Zhang, et al. "Formation of metal nanowires on suspended single-walled carbon nanotubes," Appl. Phys. Lett., 2000, vol. 77, pp. 3015-3017.

Javey, A. et al., "Carbon Nanotube Transistor Arrays for Multistage Complementary Logic and Ring Oscillators," Nano Letters, 2002, vol. 2(9), pp. 929-932.

Bachtold, A. et al., "Logic Circuits with Carbon Nanotube Transistors," Science, 2001, vol. 294, pp. 1317-1320.

Martel, R. et al., "Carbon Nanotube Field-Effect Transistors and Logic Circuits," DAC, 2002, vol. 7.4, pp. 94-98.

Hoenlein, W. et al., "Carbon nanotubes for microelectronics: status and future prospects," Materials Science and Engineering, 2003, vol. 23, pp. 663-669.

Huang, Y. et al., "Logic Gates and Computation from Assembled Nanowire Building Blocks," Science, 2001, vol. 294, pp. 1313-1316.

Derycke, V. et al., "Carbon Nanotube Inter- and Intramolecular Logic Gates," Nano Letters, 2001, vol. 1(9), pp. 453-456.

Franklin, N.R. et al., "Integration of suspended carbon nanotube arrays into electronic devices and electromechanical systems," Appl. Phys. Lett., vol. 81(5), pp. 913-915, no date.

Collier, C.P. et al., "Electronically Configurable Molecular-Based Logic Gates," SCIENCE 1999, vol. 285, pp. 391-394.

Kinaret, J.M., "A carbon-nanotube-based nanorelay," Applied Physics Letters, 2003, vol. 82(8), pp. 1287-1289.

Dehon, A., "Array-Based Architecture for FET-Based, Nanoscale Electronics", IEEE Transactions on Nanotechnology, 2003, vol. 2(1), pp. 23-32.

Dequesnes, M. et al., "Calculation of pull-in voltages for carbon-nanotube-based nanoelectromechanical switches," Nanotechnology, 2002, vol. 13, pp. 120-131.

Zhan, W. et al., "Microelectrochemical Logic Circuits," J. Am. Soc., 2003, pp. A-B.

Ami, S. et al., "Logic gates and memory cells based on single $C_{60}$ electromechanical transistors," Nanotechnology, 2000, vol. 12, pp. 44-52.

Fuhrer, M.S. et al., "High-Mobility Nanotube Transistor Memory," Nano Letters, 2002. vol. 2(7), pp. 755-759.

Lin, Y.-M. et al., "Ambipolar-to-Unipolar Conversion of Carbon Nanotube Transistors by Gate Structure Engineering," Nano Lett. 2004, vol. 4(5), pp. 947-950.

Dequesnes, M et al., "Simulation of carbon nanotube-based nanoelectromechanical switches," Computational Nanoscience and Nanotechnology, 2002, pp. 383-386.

Bachtold, A. et al., "Logic Circuits Based on Carbon Nanotubes," Physica E, 2003, vol. 16, pp. 42-46.

Tans, S.J. et al., "Room-temperature transistor based on a single carbon nanotube," Nature, 1998, vol. 393, pp. 49-52.

Avouris, P. et al., "Carbon Nanotube Electronics," Chemical Physics, 2002, vol. 281, pp. 429-445.

Ruoff, R.S. et al., "Mechanical and thermal properties of carbon nanotubes," *Carbon*, 1995, vol. 33(7), pp. 925-930.

Robinson, L.A.W., "Self-Aligned Electrodes for Suspended Carbon Nanotube Structures," *Microelectronic Engineering*, 2003, vol. 67-68, pp. 615-622.

Tour, J. M. et al., "NanoCell Electronic Memories," *J. Am. Chem Soc.*, 2003, vol. 125, pp. 13279-13283, no date.

Fan, S. et al., "Carbon nanotube arrays on silicon substrates and their possible application," *Physica E*, 2000, vol. 8, pp. 179-183.

Soh, H. T. et al., "Integrated nanotube circuits: Controlled growth and ohmic contacting of single-walled carbon nanotubes," *Appl. Phys. Lett.* 1999 vol. 75(5), pp. 627-629.

Ajayan, P.M., et al., "Nanometre-size tubes of carbon," *Rep. Prog. Phys.*, 1997. vol. 60, pp. 1025-1062.

Sreekumar, T.V., et al., "Single-wall Carbon Nanotube Films", *Chem. Mater.* 2003, vol. 15, pp. 175-178.

Verissimo-Alves, M. et al., "Electromechanical effects in carbon nanotubes: *Ab initio* and analytical tight-binding calculations," *Phys. Rev. B*, 2003, vol. 67, pp. 161401-1=161401-4.

Radosavljevic, M. et al., "Nonvolatile molecular memory elements based on ambipolar nanotube field effect transistors," *Nano Letters*, 2002, vol. 2(7), pp. 761-764.

Farajian, A. A. et al., "Electronic transport through bent carbon nanotubes: Nanoelectromechanical sensors and switches," *Phys. Rev. B*, 2003, vol. 67, pp. 205423-1=205423-6.

Fischer, J.E. et al., "Magnetically aligned single wall carbon nanotube films: Preferred orientation and anisotropic transport properties," *Journal of Appl. Phys.*, 2003, vol. 93(4), pp. 2157-2163.

Casavant, M.J. et al., "Neat macroscopic membranes of aligned carbon nanotubes," *Journal of Appl. Phys.*, 2003, vol. 93(4), pp. 2153-2156.

Cui, J.B. et al., "Carbon Nanotube Memory Devices of High Charge Storage Stability," *Appl. Phys. Lett.*, 2002, vol. 81(17), pp. 3260-3262.

Sapmaz, S. et al., "Carbon nanotubes as nanoelectromechanical systems," *Phys. Rev. B.*, 2003, vol. 67, pp. 235414-1=235414-6.

Berhan, L. et al., "Mechanical properties of Nanotube sheets: alterations in joint morphology and achievable moduli in manufacturable materials," *Journal of Appl. Phys.*, 2004, vol. 95(8), pp. 4335-4344.

Nardelli, M. Buongiomo et al., "Mechanical properties, defects and electronic behavior of carbon nanotubes," *Carbon*, 2000, vol. 38, pp. 1703-1711.

Cao, J. et al., "Electromechanical properties of metallic, quasimetallic, and semiconducting carbon nanotubes under stretching," *Phys. Rev. Lett.*, 2003, vol. 90(15), pp. 157601-1=157601-4.

* cited by examiner

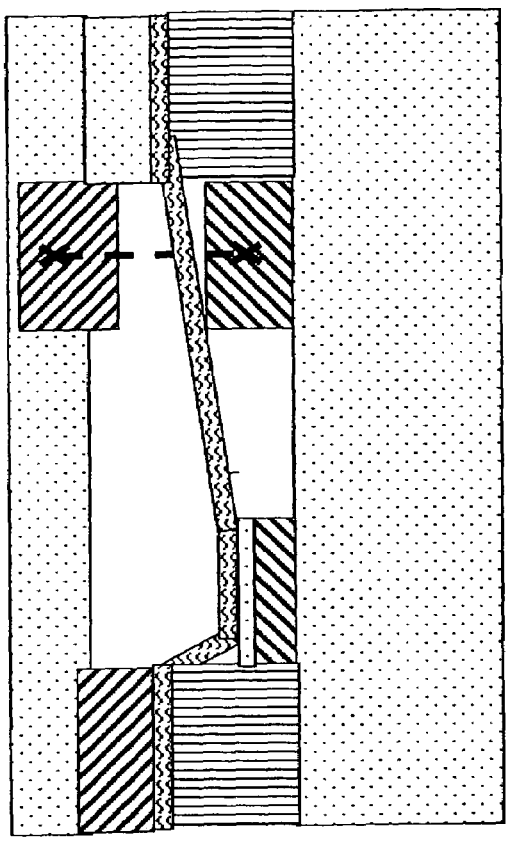
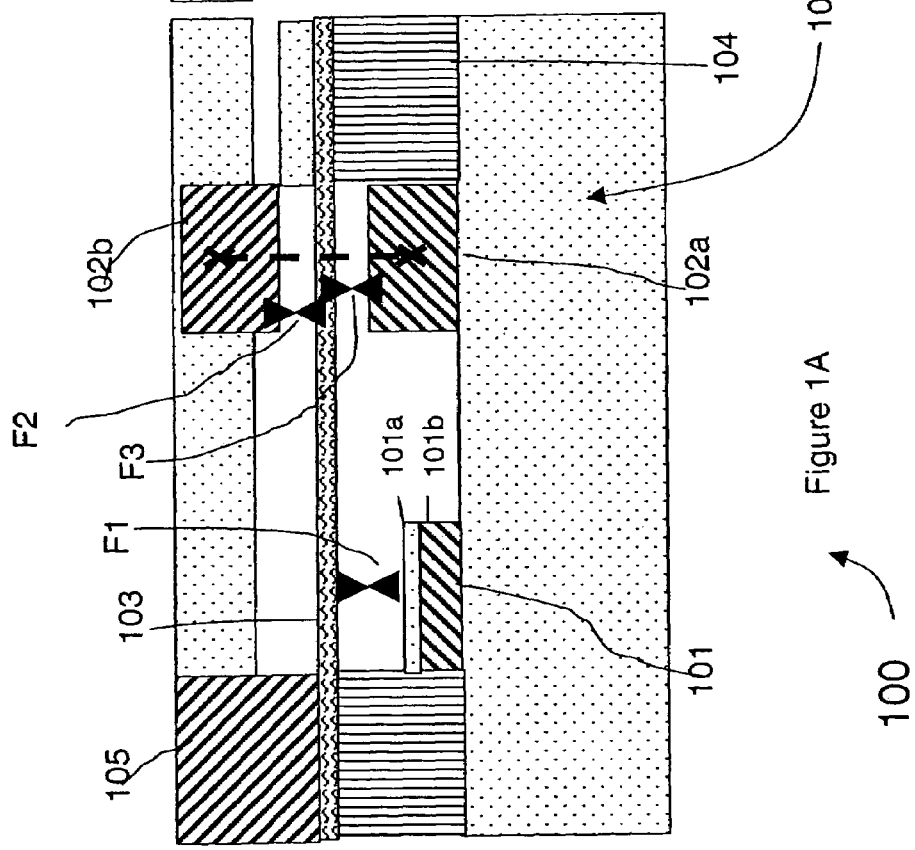
Figure 1B
Figure 1A

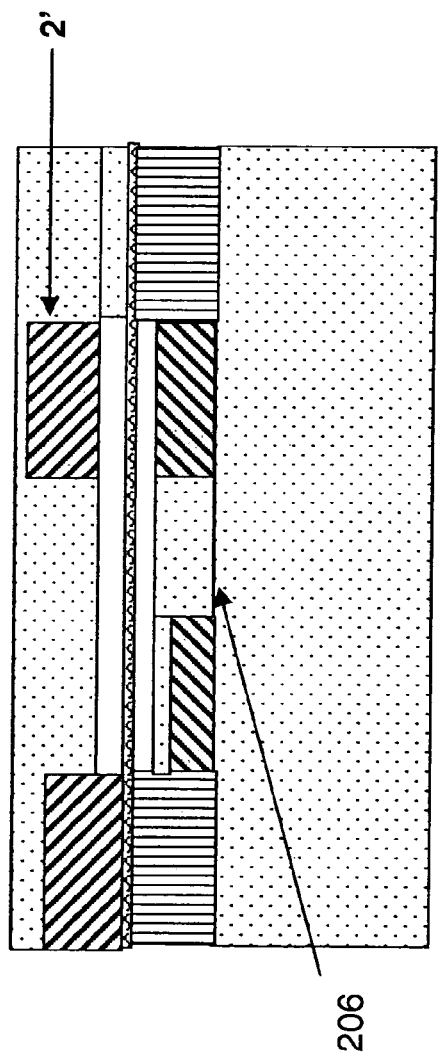
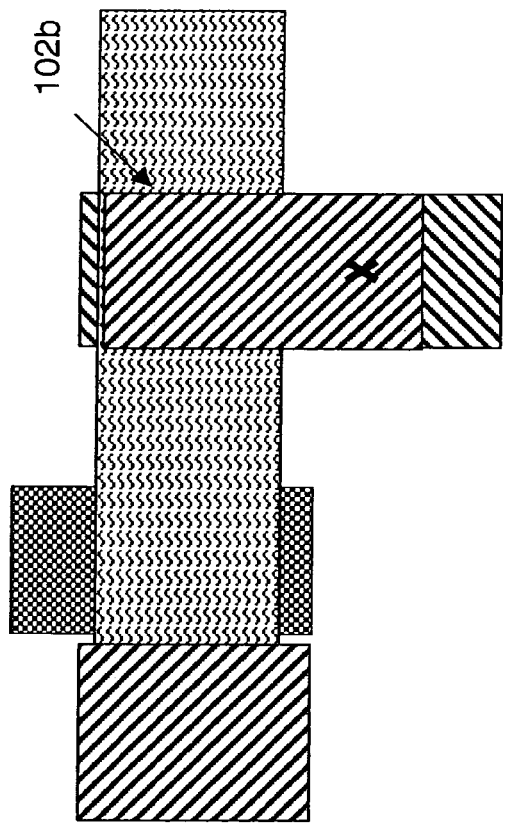
Figure 2A
Figure 2B

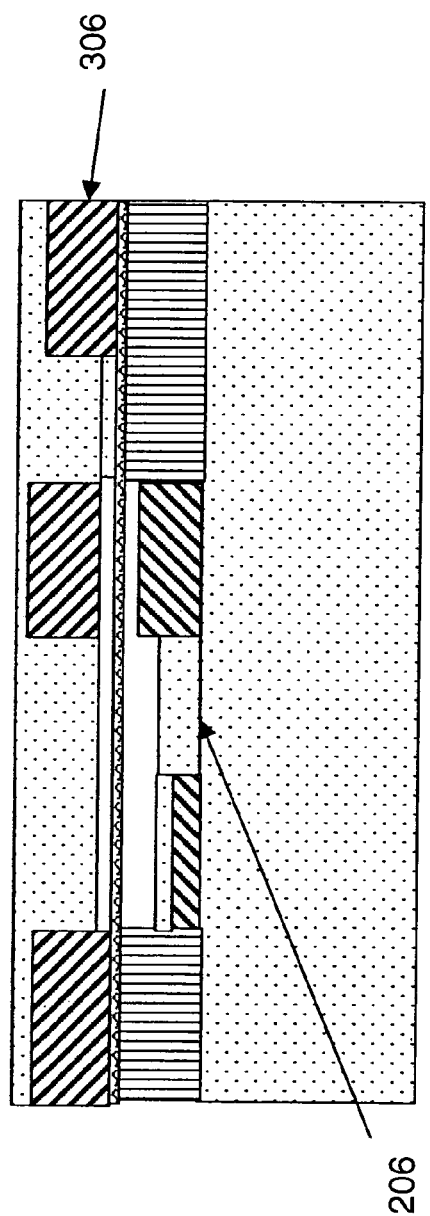
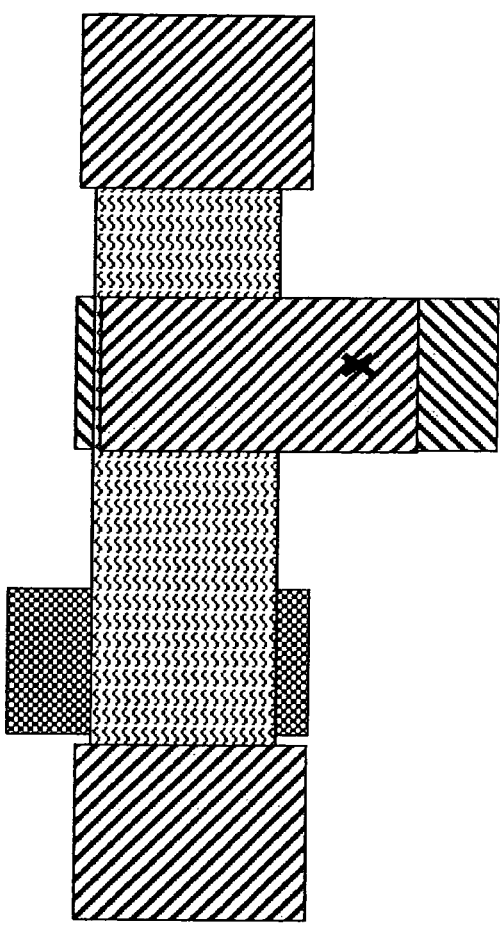
Figure 5A
Figure 5B

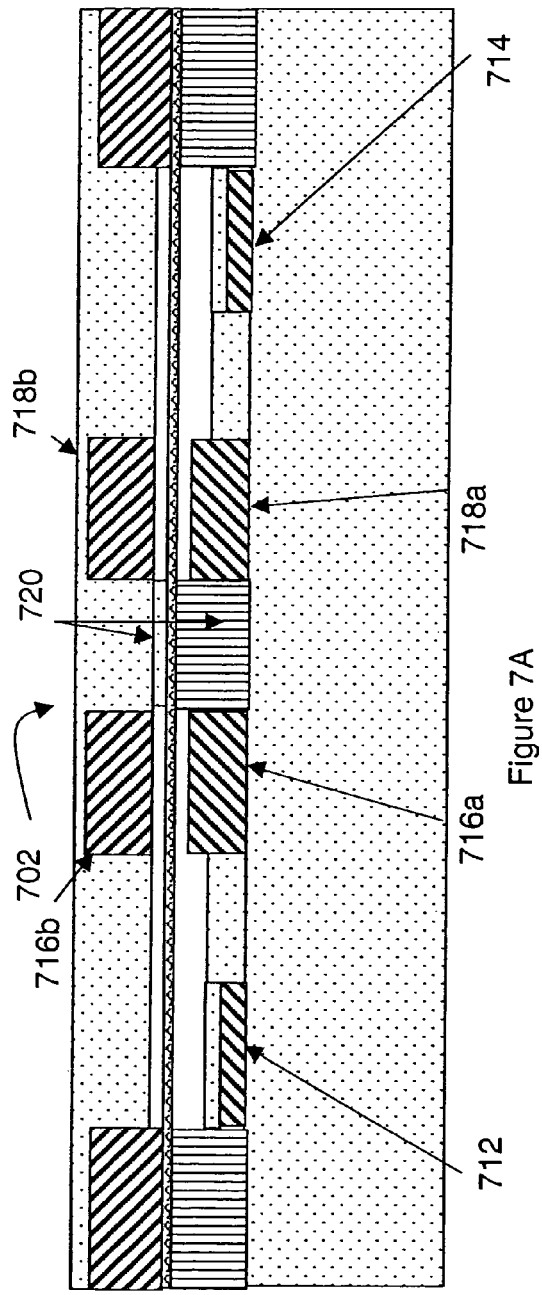
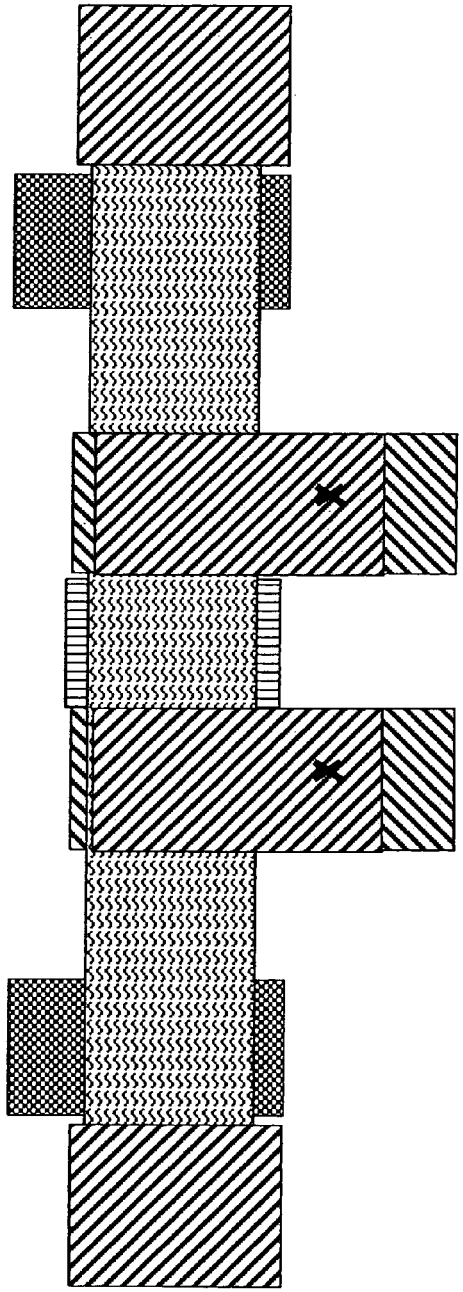
Figure 7A
Figure 7B

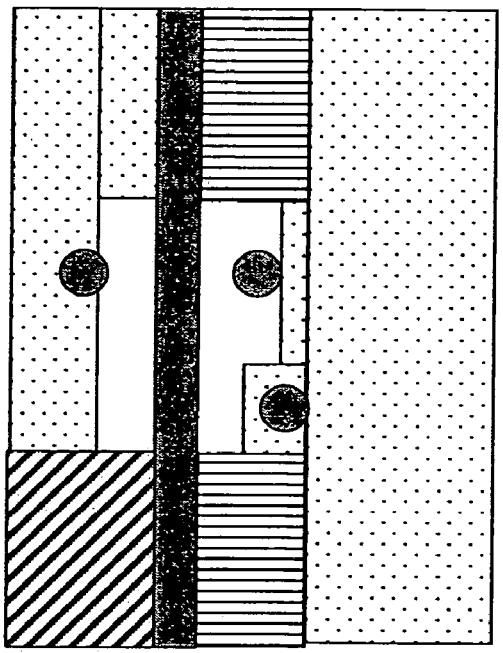
Figure 8A: NT Device Cross Section – SINGLE NANOTUBES
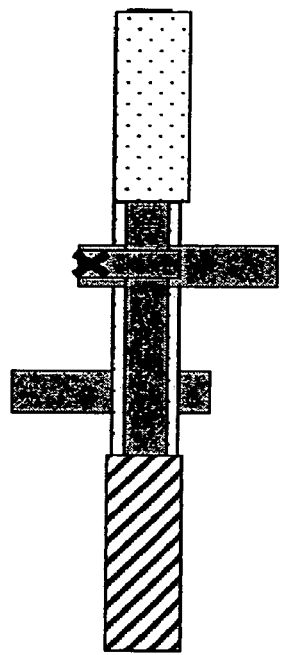
Figure 8B: NT Device – Top View – SINGLE NANOTUBES

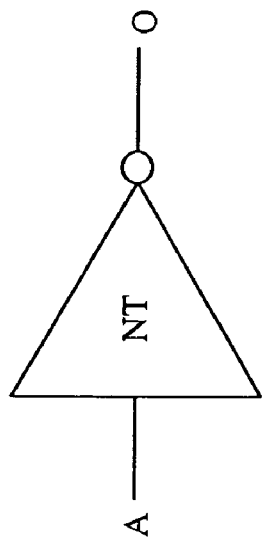
Figure 9B
INVERTER TRUTH TABLE
| A | O |
|---|---|
| 0 | 1 |
| 1 | 0 |
Figure 9C
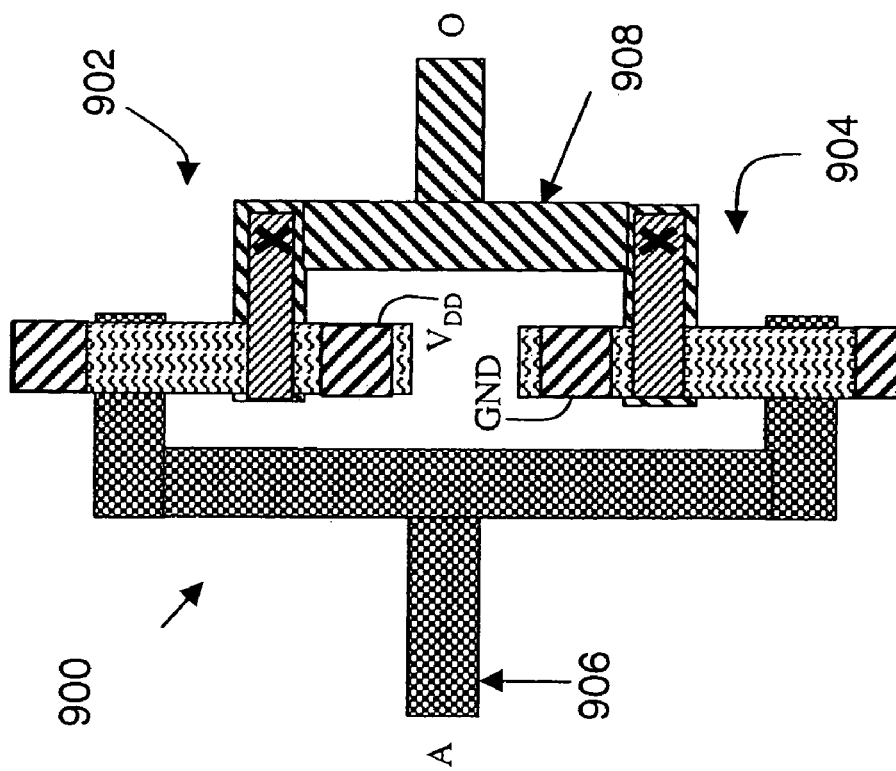
Figure 9A

INVERTER TRUTH TABLE

INVERTER TRUTH TABLE

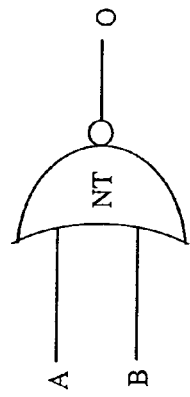
Figure 12B
| A | B | O |
|---|---|---|
| 0 | 0 | 1 |
| 0 | 1 | 0 |
| 1 | 0 | 0 |
| 1 | 1 | 0 |
NOR TRUTH TABLE
Figure 12C
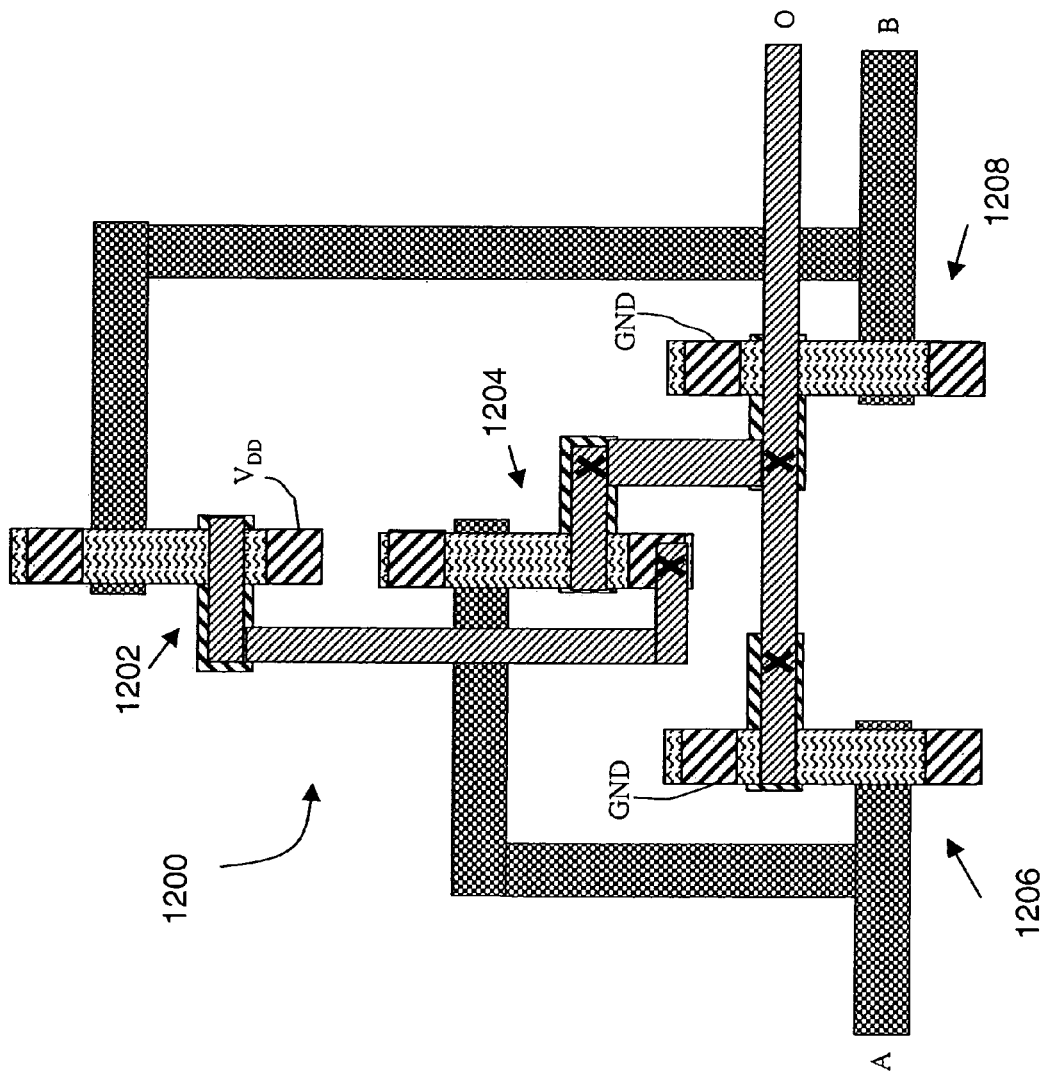
Figure 12A

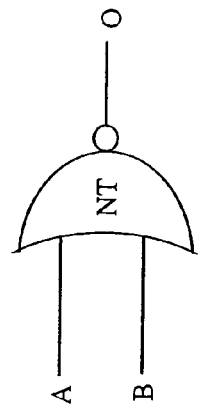
Figure 13B
| A | B | O |
|---|---|---|
| 0 | 0 | 1 |
| 0 | 1 | 0 |
| 1 | 0 | 0 |
| 1 | 1 | 0 |
NOR TRUTH TABLE
Figure 13C
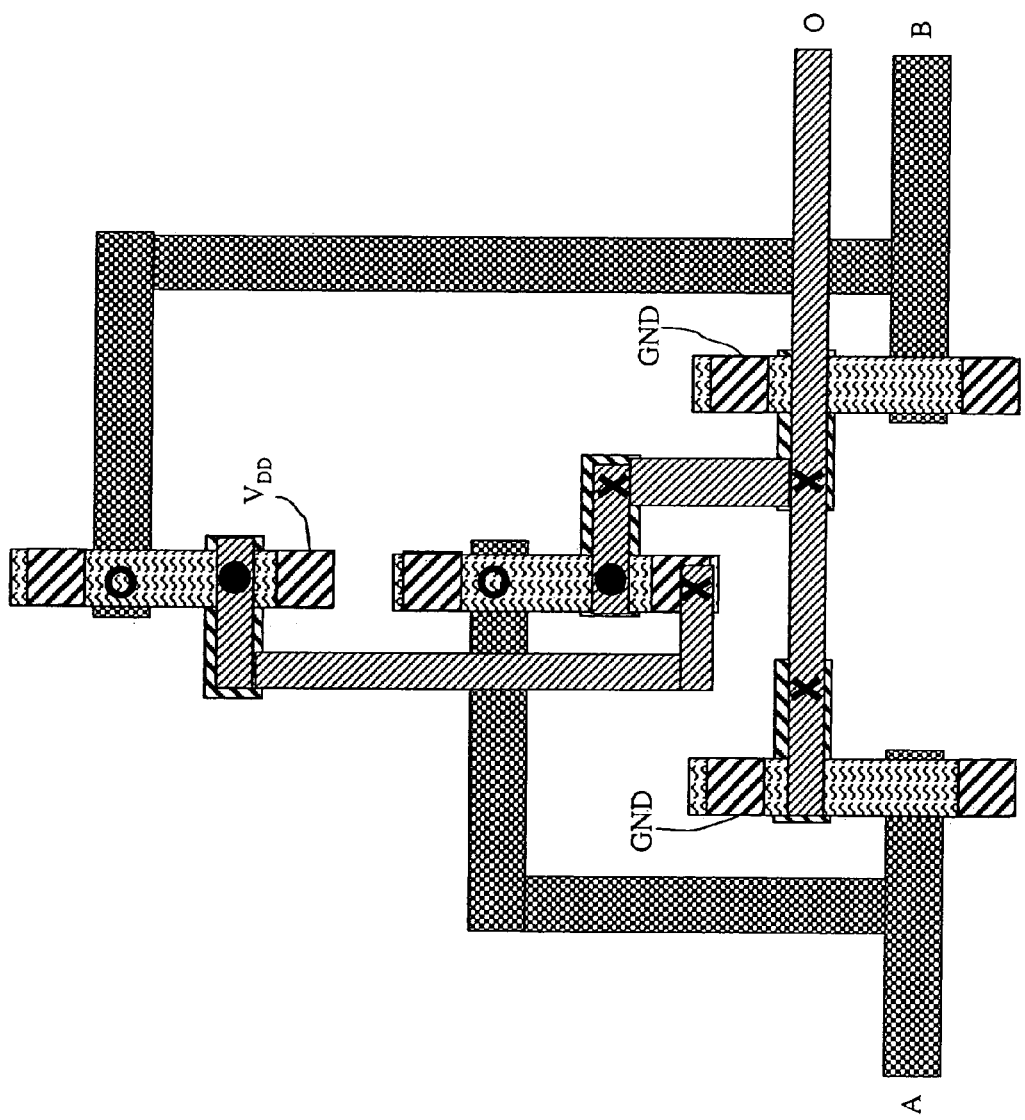
Figure 13A

NOR TRUTH TABLE

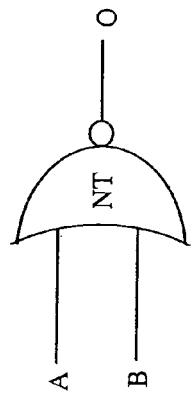
Figure 15B
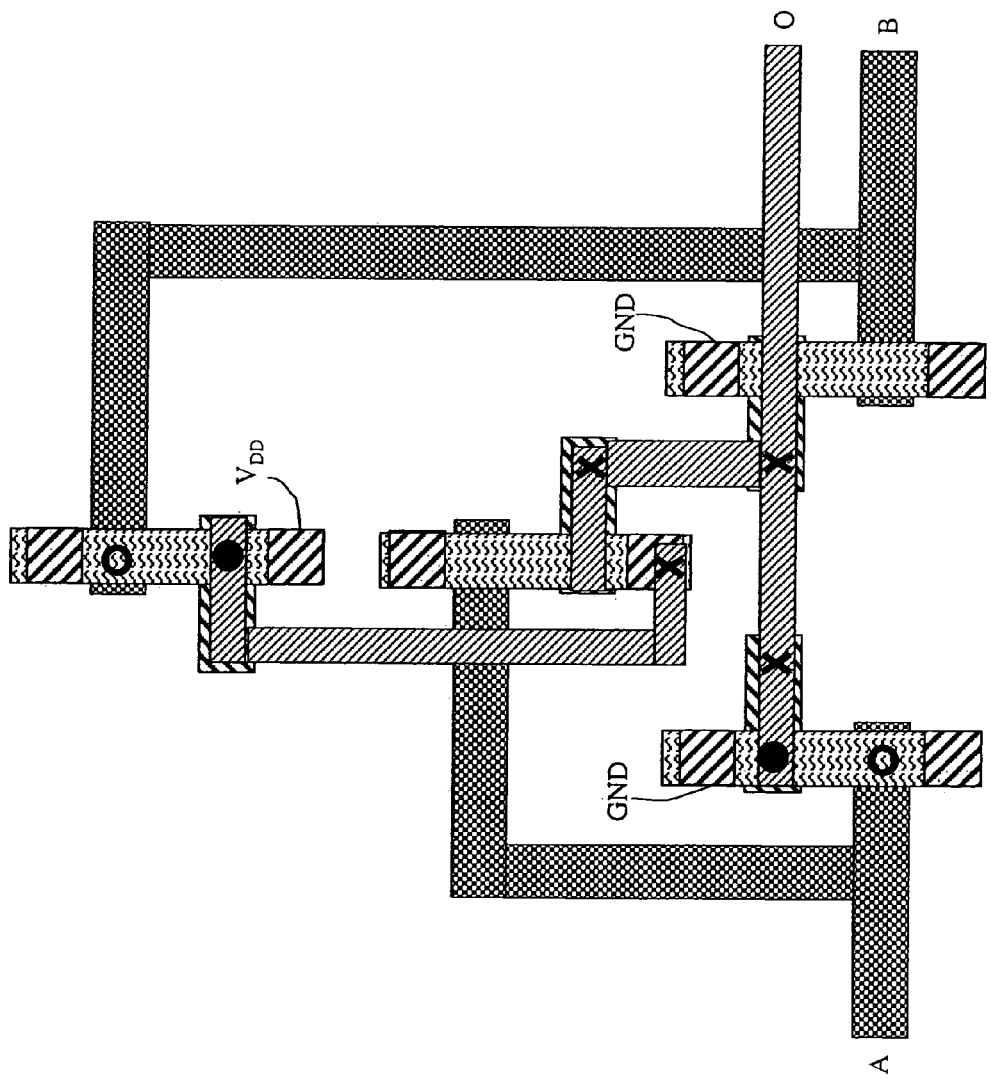
Figure 15A
NOR TRUTH TABLE
Figure 15C

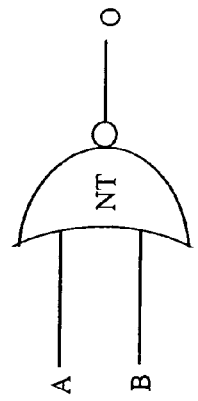
Figure 16B
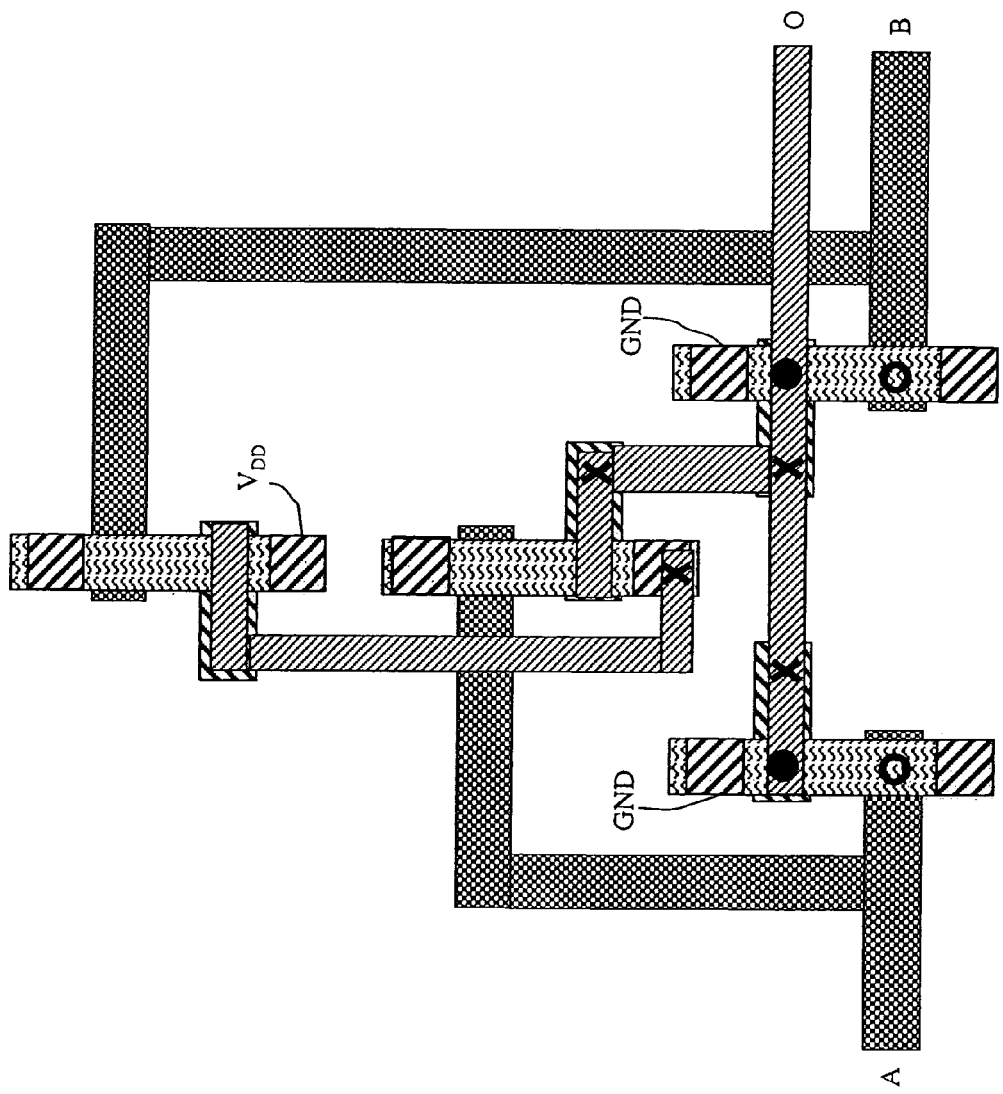
NOR TRUTH TABLE
Figure 16C
Figure 16A

RING OSCILLATOR WITH ODD NUMBER OF STAGES

NANOTUBE-BASED SWITCHING ELEMENTS AND LOGIC CIRCUITS

CROSS-REFERENCE TO RELATED APPLICATIONS

This application claims priority under 35 U.S.C. § 119(e) to U.S. Provisional Pat. Apl., Ser. No. 60/494,889, filed on Aug. 13, 2003, entitled Nanoelectromechanical Nanotube-Based Logic, which is incorporated herein by reference in its entirety.

This application is related to the following references:

U.S. patent application Ser. No. 10/917,794, filed on date even herewith, entitled Nanotube-Based Switching Elements; [Nan-31]

U.S. patent application Ser. No. not yet assigned, filed on date even herewith, entitled Isolation Structure for Deflectable Nanotube Elements; [Nan-79]

U.S. patent application Ser. No. 10/918,085 filed on date even herewith, entitled Nanotube-Based Switching Elements with Multiple Controls; [Nan-45]

U.S. patent application Ser. No. 10/917,932, filed on date even herewith, entitled Circuits Made from Nanotube-Based Switching Elements with Multiple Controls; [Nan-80]

U.S. patent application Ser. No. 10/918,181, filed on date even herewith, entitled Nanotube Device Structure and Methods of Fabrication. [Nan-46]

BACKGROUND

1. Technical Field

The present application generally relates to nanotube switching circuits and in particular to nanotube switching circuits that use nanotubes to form a conductive channel of the switch and that may be interconnected into larger circuits, such as Boolean logic circuits.

2. Discussion of Related Art

Digital logic circuits are used in personal computers, portable electronic devices such as personal organizers and calculators, electronic entertainment devices, and in control circuits for appliances, telephone switching systems, automobiles, aircraft and other items of manufacture. Early digital logic was constructed out of discrete switching elements composed of individual bipolar transistors. With the invention of the bipolar integrated circuit, large numbers of individual switching elements could be combined on a single silicon substrate to create complete digital logic circuits such as inverters, NAND gates, NOR gates, flip-flops, adders, etc. However, the density of bipolar digital integrated circuits is limited by their high power consumption and the ability of packaging technology to dissipate the heat produced while the circuits are operating. The availability of metal oxide semiconductor ("MOS") integrated circuits using field effect transistor ("FET") switching elements significantly reduces the power consumption of digital logic and enables the construction of the high density, complex digital circuits used in current technology. The density and operating speed of MOS digital circuits are still limited by the need to dissipate the heat produced when the device is operating.

Digital logic integrated circuits constructed from bipolar or MOS devices do not function correctly under conditions of high heat or extreme environments. Current digital integrated circuits are normally designed to operate at temperatures less than 100 degrees centigrade and few operate at temperatures over 200 degrees centigrade. In conventional integrated circuits, the leakage current of the individual switching elements in the "off" state increases rapidly with temperature. As leakage current increases, the operating temperature of the device rises, the power consumed by the circuit increases, and the difficulty of discriminating the off state from the on state reduces circuit reliability. Conventional digital logic circuits also short internally when subjected to extreme environments they may generateelectrical currents inside the semiconductor material. It is possible to manufacture integrated circuits with special devices and isolation techniques so that they remain operational when exposed to extreme environments, but the high cost of these devices limits their availability and practicality. In addition, such digital circuits exhibit timing differences from their normal counterparts, requiring additional design verification to add protection to an existing design.

Integrated circuits constructed from either bipolar or FET switching elements are volatile. They only maintain their internal logical state while power is applied to the device. When power is removed, the internal state is lost unless some type of non-volatile memory circuit, such as EEPROM (electrically erasable programmable read-only memory), is added internal or external to the device to maintain the logical state. Even if non-volatile memory is utilized to maintain the logical state, additional circuitry is necessary to transfer the digital logic state to the memory before power is lost, and to restore the state of the individual logic circuits when power is restored to the device. Alternative solutions to avoid losing information in volatile digital circuits, such as battery backup, also add cost and complexity to digital designs.

Important characteristics for logic circuits in an electronic device are low cost, high density, low power, and high speed. Conventional logic solutions are limited to silicon substrates, but logic circuits built on other substrates would allow logic devices to be integrated directly into many manufactured products in a single step, further reducing cost.

Devices have been proposed which use nanoscopic wires, such as single-walled carbon nanotubes, to form crossbar junctions to serve as memory cells. (See WO 01/03208, Nanoscopic Wire-Based Devices, Arrays, and Methods of Their Manufacture; and Thomas Rueckes et al., "Carbon Nanotube-Based Nonvolatile Random Access Memory for Molecular Computing," Science, vol. 289, pp. 94–97, 7 Jul., 2000.) Hereinafter these devices are called nanotube wire crossbar memories (NTWCMs). Under these proposals, individual single-walled nanotube wires suspended over other wires define memory cells. Electrical signals are written to one or both wires to cause them to physically attract or repel relative to one another. Each physical state (i.e., attracted or repelled wires) corresponds to an electrical state. Repelled wires are an open circuit junction. Attracted wires are a closed state forming a rectified junction. When electrical power is removed from the junction, the wires retain their physical (and thus electrical) state thereby forming a non-volatile memory cell.

U.S. Patent Publication No. 2003-0021966 discloses, among other things, electromechanical circuits, such as memory cells, in which circuits include a structure having electrically conductive traces and supports extending from a surface of a substrate. Nanotube ribbons that can electromechanically deform, or switch are suspended by the supports that cross the electrically conductive traces. Each ribbon comprises one or more nanotubes. The ribbons are typically formed from selectively removing material from a layer or matted fabric of nanotubes.

For example, as disclosed in U.S. Patent Publication No. 2003-0021966, a nanofabric may be patterned into ribbons, and the ribbons can be used as a component to create non-volatile electromechanical memory cells. The ribbon is electromechanically-deflectable in response to electrical stimulus of control traces and/or the ribbon. The deflected, physical state of the ribbon may be made to represent a corresponding information state. The deflected, physical state has non-volatile properties, meaning the ribbon retains its physical (and therefore informational) state even if power to the memory cell is removed. As explained in U.S. Patent Publication No. 2003-0124325, three-trace architectures may be used for electromechanical memory cells, in which the two of the traces are electrodes to control the deflection of the ribbon.

The use of an electromechanical bi-stable device for digital information storage has also been suggested (c.f. U.S. Pat. No. 4,979,149: Non-volatile memory device including a micro-mechanical storage element).

The creation and operation of bi-stable, nano-electromechanical switches based on carbon nanotubes (including mono-layers constructed thereof) and metal electrodes has been detailed in a previous patent application of Nantero, Inc. (U.S. Pat. Nos. 6,574,130, 6,643,165, 6,706,402; U.S. patent application Ser. Nos. 09/915,093, 10/033,323, 10/033,032, 10/128,117, 10/341,005, 10/341,055, 10/341,054, 10/341,130, 10/776,059, and 10/776,572, the contents of which are hereby incorporated by reference in their entireties).

SUMMARY

The present invention provides nanotube-based switching elements and logic circuits.

Under another aspect of the invention, a Boolean logic circuit includes at least one input terminal and an output terminal, and a network of nanotube switching elements electrically disposed between said at least one input terminal and said output terminal. The network of nanotube switching elements effectuates a Boolean function transformation of Boolean signals on said at least one input terminal. The Boolean function transformation includes a Boolean inversion within the function.

Under another aspect of the invention, the network of nanotube switching elements effectuates a Boolean NOT function of signals on the at least one input terminal.

Under another aspect of the invention, the network of nanotube switching elements effectuates a Boolean NOR function of signals on at least first and second input terminals.

BRIEF DESCRIPTION OF THE DRAWINGS

In the Drawing,

FIGS. 1A–1C illustrate cross-sectional views of a nanotube switching element of certain embodiments in two different states and include a layout view of such element;

FIGS. 2A and 2B show an alternative embodiment of a nanotube switching element in cross section view and plan view;

FIGS. 5A and 5B show an alternative embodiment of a nanotube switching element in cross section view and plan view;

FIGS. 7A and 7B show an alternative embodiment of a nanotube switching element in cross section view and plan view;

FIGS. 8A and 8B show an alternative embodiment of a nanotube switching element in cross section view and plan view;

FIGS. 9–11C show the layout and operation of an exemplary inverter circuit;

FIGS. 12A–16C show the layout and operation of an exemplary NOR circuit; and

DETAILED DESCRIPTION

Preferred embodiments of the invention provide switching elements in which a nanotube-based channel may be controllably formed, under the influence of a control node, so that a signal may be transferred to an output node. The transferred signal may be a varying signal or a reference signal, depending on the manner in which the switching element is utilized and arranged. Preferred embodiments provide an isolation structure so that such signal transfer and the switching element's operation is substantially invariant to the output state. For example, the output node may float and/or be tied to other electrical components and the circuit will operate in a predictable switch-like manner. Consequently, the switching elements may be formed into larger circuits, such as Boolean logic circuits. Under some embodiments, the switching elements are used as complementary circuitry.

Figure 1C:
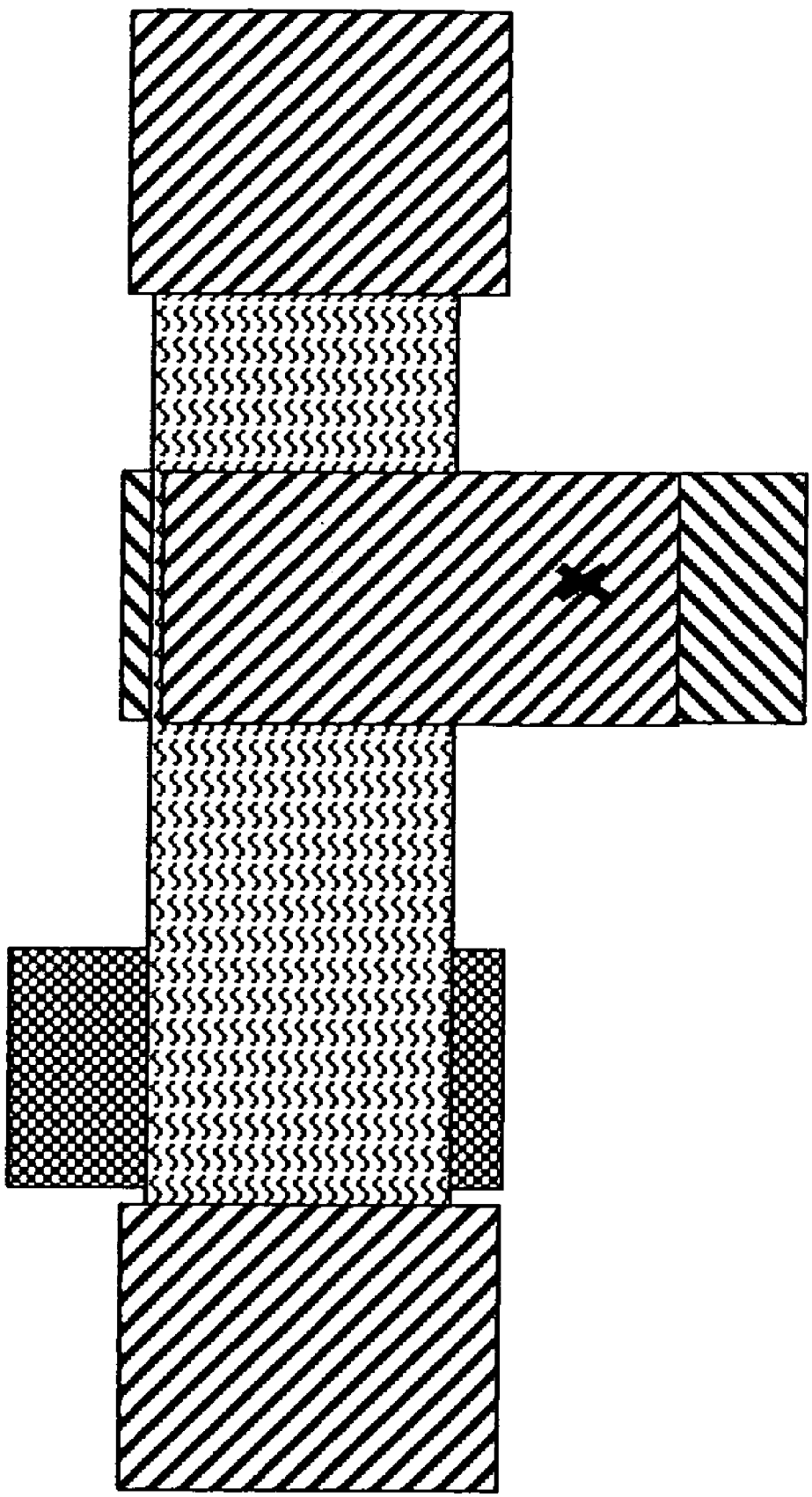

FIGS. 1A and 1B are cross-sectional views of an exemplary nanotube switching element and FIG. 1C is a layout view of such element. The switching element 100 includes a control electrode 101, a nanotube channel element 103, an output node 102 (in turn including output electrodes 102a and 102b), supports 104 and signal electrode 105.

In this embodiment, the nanotube channel element 103 is made of a porous fabric of nanotubes, e.g., single walled carbon nanotubes. In preferred embodiments, each nanotube has homogenous chirality, being either a metallic or semi-conductive species. The fabric however may contain a combination of nanotubes of different species, and the relative amounts are preferably tailorable, e.g., fabrics with higher concentrations of metallic species. The element 103 is lithographically defined to a predetermined shape, as explained in the patent references incorporated by reference herein. The nanotube channel element of preferred embodiments is suspended by insulative supports 104 in spaced relation to the control electrode 101 and the output electrodes 102a,b. The nanotube channel element 103 is held to the insulating support structures 104 by friction. In other embodiments, the nanotube channel element 103 may be held by other means, such as by anchoring the nanofabric to the insulating support structures using any of a variety of techniques. In this arrangement, the spacing between channel element 103 and control electrode 101 is larger than the spacing between channel element 103 and output electrodes 102a,b. In certain preferred embodiments, the articles include substantially a monolayer of carbon nanotubes. In certain embodiments the nanotubes are preferred to be single-walled carbon nanotubes. Such nanotubes can be tuned to have a resistance between 0.2–100 kOhm/□ or in some cases from 100 kOh/□ to 1 GOhm/□.

Signal electrode 105 is in electrical communication with channel element 103. In the preferred embodiment, the electrode 105 is in fixed, permanent contact with the channel element 103.

Specifically, the nanotube channel element may be coupled to another material (such as signal electrode 105) by introducing a matrix material into the spaces between nanotubes in a porous nanofabric to form a conducting composite junction, as described in the patent references incorporated herein. Electrical and mechanical advantages may be obtained by using such composite junctions and connections. In one example, a conducting material is deposited onto the nanofabric and is allowed to penetrate into the spaces within the porous nanofabric, thus forming an improved electrical connection to the nanofabric and reduces contact resistance in the article. In another example, an insulating material is deposited onto the nanofabric and is allowed to penetrate into the spaces within the porous nanofabric, thus forming an improved mechanical pinning contact that increases resistance to strain in the article (prevent nanotube slipping).

Evaporated or spin-coated material such as metals, semiconductors or insulators—especially silicon, tungsten, titanium, silicon oxide, aluminum oxide or polyimide—may be used to increase the pinning strength. The friction interaction can be increased through the use of chemical interactions, including covalent bonding through the use of carbon compounds such as pyrenes or other chemically reactive species. See R. J. Chen et al., "Noncovalent Sidewall Functionalization of Single-Walled Carbon Nanotubes for Protein Immobilization," J. Am. Chem. Soc., vol. 123, pp. 3838–39 (2001), and Dai et al., Appl. Phys. Lett., vol. 77, pp. 3015–17 (2000), for exemplary techniques for pinning and coating nanotubes by metals. See also WO 01/03208 for techniques.

In preferred embodiments, control electrode 101 is made of a conductive material portion 101*b* covered with an insulator portion 101*a* on the surface facing nanotube channel element 103. It is insulated so there is no electrical connection between the nanotube fabric of the nanotube channel element and the conductive portion 101*b* of electrode 101, when the channel element 103 is deflected as shown in FIG. 1B. In this way, any signal on channel element 103 is transferred to output node 102.

Output node 102 has two electrodes 102*a,b* on opposite sides of the nanotube channel element 103. In the state shown in FIG. 1A, the distance between each electrode and the channel element 103 is approximately the same. However, in this embodiment the distance between the output electrode and the channel element 103 is smaller than the distance between the channel element 103 and the control electrode 101. The upper electrode 102*b* is part of an upper structure. The lower electrode 102*a* in this embodiment also serves as the output node from which the signal may be connected to other circuit elements. In a preferred embodiment, the two electrodes 102*a,b* are electrically connected so that they are at substantially the same voltage and create substantially the same electrostatic force (though in opposite directions) on the nanotube channel element 103.

Under certain embodiments, input, control, and output electrodes are typically in the range of 50 to 200 nm wide. Control electrode oxide thickness is in the range of 5 to 30 nm. Supports are typically in the range of 50 to 200 nm. The suspended length of the nanotube element (between pinning supports) is typically in the range of 100 to 300 nm. Nanotube element fabric layer thickness is on the order of 0.5 to 3 nm (for SWNTs). The insulator surface of the control electrode is typically 5 to 30 nm. The output electrode(s) to nanotube spacing is typically 5 to 30 nm, for example. For volatile operation, the ratio of suspended nanotube length to the gap between the control electrode insulator surface and the nanotube element is typically 5 to 1. This, or another suitable ratio, is selected to ensure that the restoring mechanical force of the nanotube element exceeds the van der Waals forces on the nanotube element.

The nanotube switching element 100 operates in the following way. If signal electrode 105 and control electrode 101 have a potential difference that is sufficiently large (via respective signals on the electrodes), the relationship of signals will create an electrostatic force F1 that is sufficiently large to cause the suspended, nanotube channel element 103 to deflect into mechanical contact with electrode 101. (This aspect of operation is described in the incorporated patent references.) This deflection is depicted in FIG. 1B. The attractive force F1 stretches and deflects the nanotube fabric of channel element 103 until it contacts the insulated region 101*a* of the control electrode 101. The nanotube channel element is thereby strained, and there is a restoring tensil force, dependent on the geometrical relationship of the circuit, among other things.

By using appropriate geometries of components, the switching element 100 then attains the closed, conductive state of FIG. 1B in which the nanotube channel 103 mechanically contacts the control electrode 101 and also output electrode 102*a*. Since the control electrode 101 is covered with insulator 101*a* (and therefore does not electrically connect [short] the signal on channel element 103 with the control signal on control element 10*b*) any signal on electrode 105 is transferred from the electrode 105 to the output electrode 102*a* via the nanotube channel element 103. The signal on electrode 105 may be a varying signal, a fixed signal, a reference signal, a power supply line, or ground line. The channel formation is controlled via the signal applied to the control electrode 101. Specifically the signal applied to control electrode 101 needs to be sufficiently different in relation to the signal on electrode 105 to create the electrostatic force to deflect the nanotube channel element to cause the channel element 103 to deflect and to form the channel between electrode 105 and output electrode 102*a*.

In contrast, if the relationship of signals on the electrode 105 and control electrode 101 is insufficiently different, then the nanotube channel element 103 is not deflected and no conductive channel is formed to the output electrode 102*a*. Instead, the channel element 103 floats. This floating state is shown in FIG. 1A. The nanotube channel element 103 has the signal from electrode 105 but this signal is not transferred to the output node 102. Instead, the state of the output node 102 depends on whatever circuitry it is connected to and the state of such circuitry. The state of output node 102 in this regard floats and is independent of the switching element 100.

If the voltage difference between the control electrode 101 and the channel element 103 is removed, the channel element 103 returns to the non-elongated state (see FIG. 1A), and the electrical connection or path between the electrode 105 to the output node 102 is opened. The output voltage on the output electrode 102*a,b* is of opposite polarity to that of the control electrode 101 when a channel is formed. When there is no connection, or channel, between the electrode 105 and the output electrode 102*a*, the output node 102 may be at any voltage with respect to the channel element 103, the control electrode 101, and the signal electode 105.

The output node 102 is constructed to include an isolation structure in which the operation of the channel element 103 and thereby the formation of the channel is invariant to the state of the output node 102. Since in the preferred embodiment the channel element is electromechanically deflectable in response to electrostatically attractive forces, a floating output node 102 in principle could have any potential. Consequently, the potential on an output node may be sufficiently different in relation to the state of the channel element 103 that it would cause deflection of the channel element 103 and disturb the operation of the switching element 100 and its channel formation; that is, the channel formation would depend on the state of an unknown floating node. In the preferred embodiment this problem is addressed with an output node that includes an isolation structure to prevent such disturbances from being caused.

Specifically, the nanotube channel element 103 is disposed between two oppositely disposed electrodes 102a,b of equal potential. Consequently, there are equal but opposing electrostatic forces F2 and F3 that result from the voltage on the output node. Because of the equal and opposing electrostatic forces, the state of output node 102 cannot cause the nanotube channel element 103 to deflect regardless of the voltages on output node 102 and nanotube channel element 103. Thus, the operation and formation of the channel is made invariant to the state of the output node.

FIGS. 2A and 2B show an alternative embodiment of a nanotube switching element in cross section view and plan view. In this embodiment the gap dimensions between the channel element 103 and electrodes are substantially the same. Moreover the control electrode 101 and the output electrode 102a are separated in part by insulative material 206.

Figure 3A:
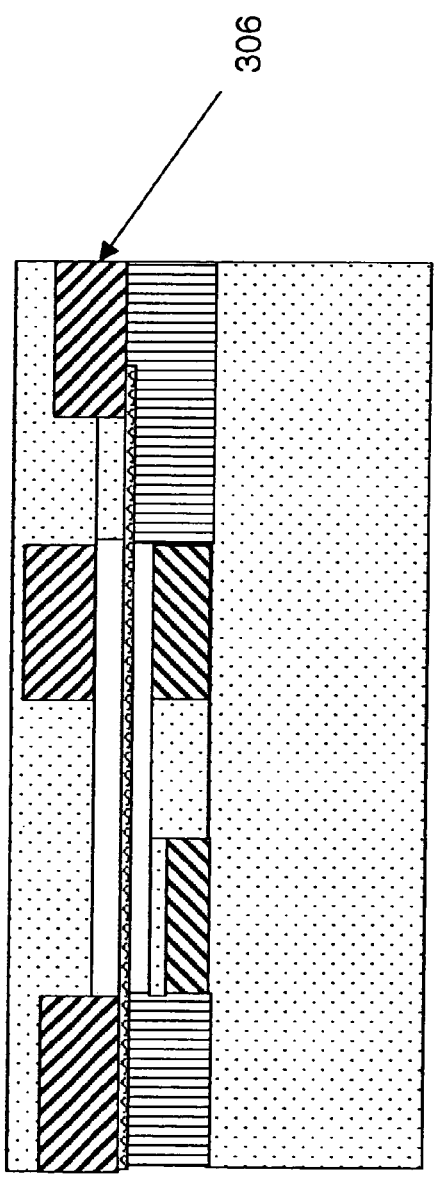
FIGS. 3A and 3B show an alternative embodiment of a nanotube switching element in cross section view and plan view.
Figure 3B:
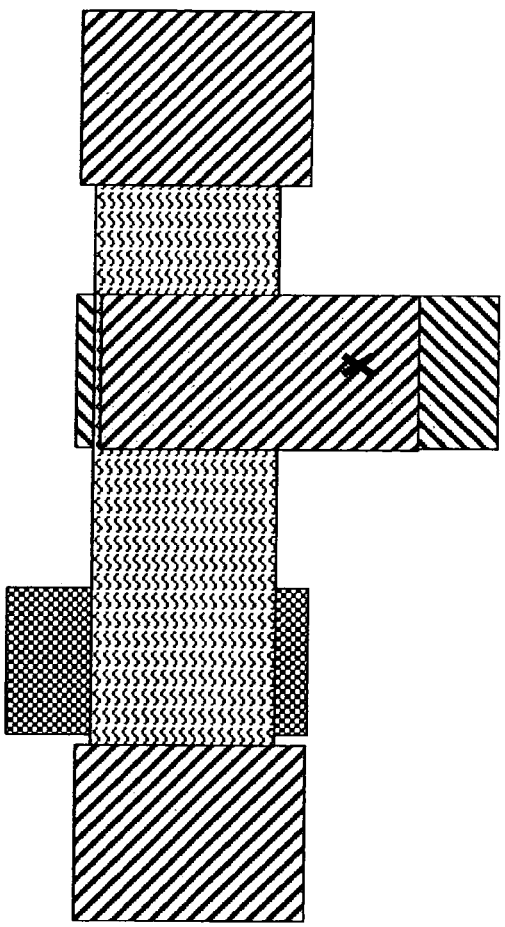

FIGS. 3A and 3B show an alternative embodiment of a nanotube switching element in cross section view and plan view. This embodiment is similar to the embodiment of FIG. 2 except that it includes another signal electrode 306 connected to the nanotube channel element 103. This extra electrode reduces the effective resistance.

Figure 4A:
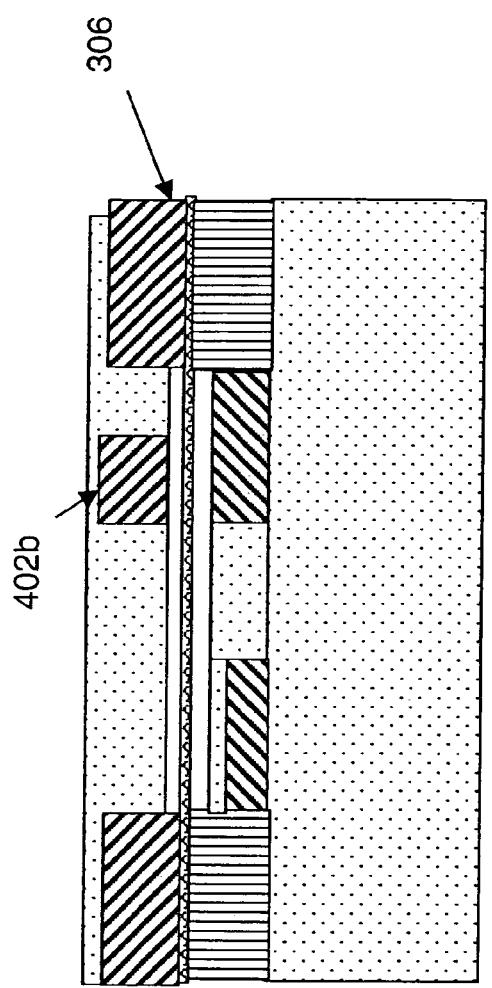
FIGS. 4A and 4B show an alternative embodiment of a nanotube switching element in cross section view and plan view.
Figure 4B:
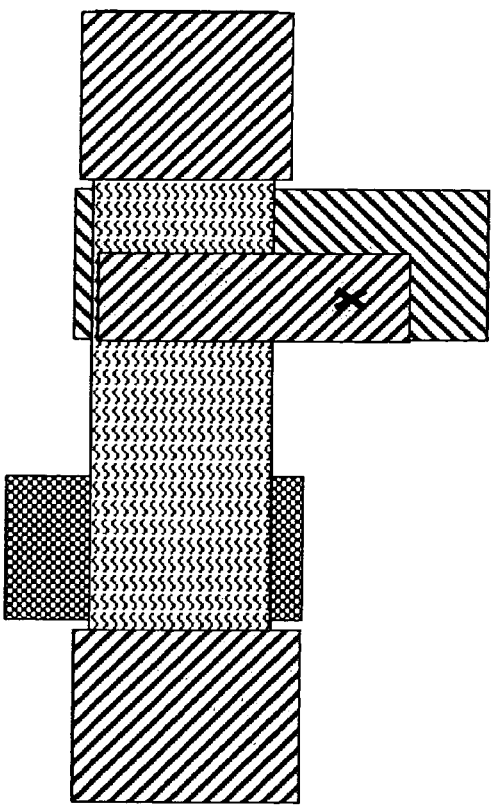

FIGS. 4A and 4B show an alternative embodiment of a nanotube switching element in cross section view and plan view. This embodiment is similar to that of FIGS. 3A and 3B, except that in this embodiment electrode 102b is replaced with electrode 402b that is narrower. This allows closer placement of signal electrode 306. The smaller electrode 402b will have a smaller electric field affect on the nanotube channel element 103 all other things being equal. If necessary the electric field effect may be tailored in other ways, e.g., altering the gap distance between electrode 402b and channel element 103.

FIGS. 5A and 5B show an alternative embodiment of a nanotube switching element in cross section view and plan view. This embodiment is similar to that of FIGS. 1A and 3A. It has the extra signal electrode 306 like that of FIG. 3A along with insulator 206, and it also has different gap dimensions for the control electrode and output electrode like that of FIG. 1.

Figure 6A:
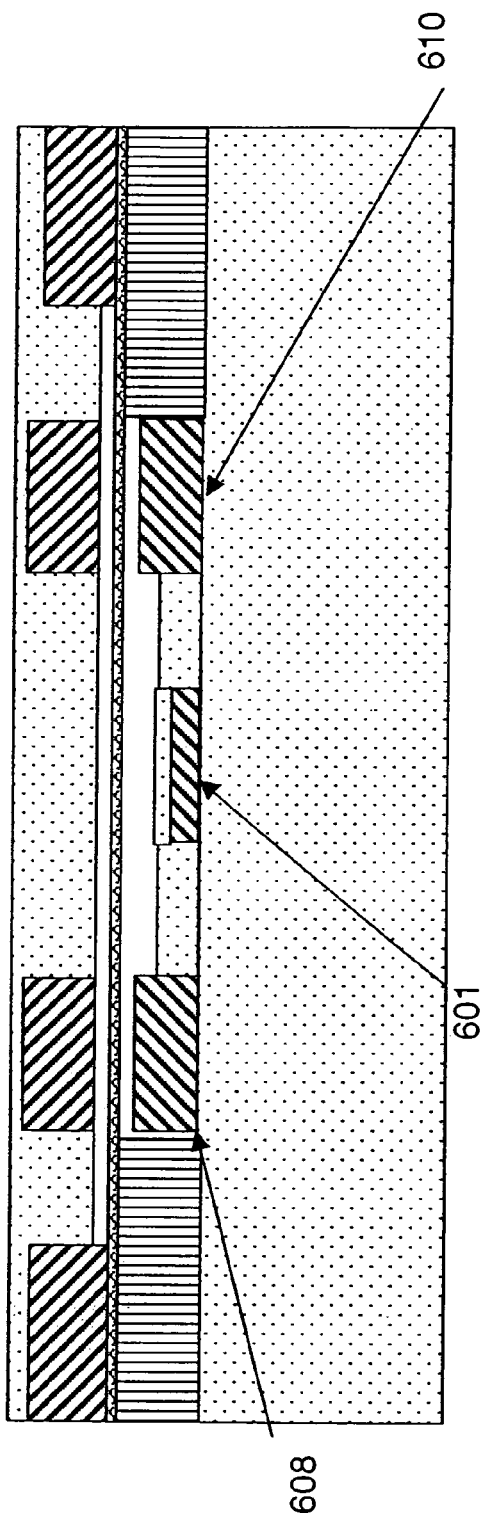
FIGS. 6A and 6B show an alternative embodiment of a nanotube switching element in cross section view and plan view.
Figure 6B:
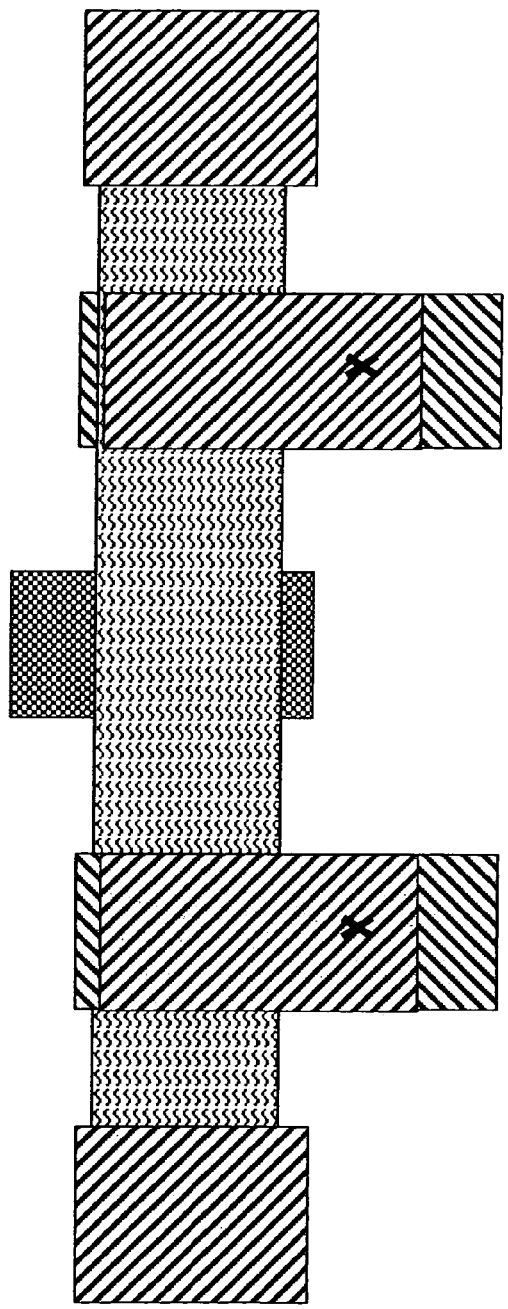

FIGS. 6A and 6B show an alternative, preferred embodiment of a nanotube switching element in cross section view and plan view. This embodiment has a control electrode 601 similar to the other embodiments but located more centrally. It has output nodes 608 and 610 located on either side of the control electrode 601. Each of the output nodes 608 and 610 includes two electrodes on opposite sides of the nanotube channel element similarly to that described before. Each of the electrodes of a given node is tied to the other. This is shown in FIG. 6B by the 'X' indication. Like some of the earlier embodiments, the gap dimension between the control electrode and channel element is different than the gap dimension between the output electrode and channel element.

If the output nodes 608 and 610 are tied together, then the embodiment essentially has redundant output electrodes and has lower resistance from parallel outputs. Alternatively, the output nodes may remain independent (as shown in FIG. 6B where they are not shown coupled), and in this case, the element may operate as an analog transfer device.

FIGS. 7A and 7B show an alternative, preferred embodiment of a nanotube switching element in cross section view and plan view. This embodiment has an output node 702 located more centrally. It has two separate control electrodes 712 and 714 (similar to those described before) located on either side of the output node 702. The output node include two pairs of output electrodes. One pair of output electrodes 716a,b is located on the left of a central pinning post 720 and a second pair of output electrodes 718a,b is located on the right of post 720. The electrodes of each pair are tied to the other as indicated by the 'X' in FIG. 7B. Thus electrode 716a is tied to 716b, and 718a is tied to 718b. The pairs in turn may be tied to each other as well, depending on the intended usage. Likewise, the control electrodes 712 and 714 may be tied together. In this fashion the control electrodes will either allow the channel element 103 to float or to mechanically and electrically contact both electrodes 716a and 718a. Alternatively, the control electrodes may be operated with independent signals. The pinning post 720 provides more support for the channel element 103 so the extended length of the channel element is effectively reduced.

FIGS. 8A and 8B show a minimum arrangement in which the channel element 103 is formed of a single nanotube, and in which the control and output electrodes are likewise formed of nanotubes. As explained herein, preferred embodiments utilize porous nanofabric to make nanotube channel elements 103. As described in the incorporated references, the fabric is formed and lithographically defined and patterned to create ribbon-like structures which may be arranged horizontally (as shown herein) or vertically (as described in incorporated references). As the minimum lithographic dimensions continue to shrink with improving technology and as the fabrics remain highly porous, a given channel element may be formed to have relatively few nanotubes with a theoretical minimum being one, as shown in FIG. 8A. Likewise the electrodes may be made from nanotubes or nanotube ribbons, if desired, as discussed in the incorporated references. Alternatively, the arrangement of FIG. 8a may be made with other manufacturing techniques that do not rely on photolithographic limits, such as disclosed in some of the incorporated patent references. The embodiment of FIG. 8 therefore has theoretically minimum sized channel element 103. It also uses nanotubes as the control electrode and output electrode, providing nanotube-to-nanotube contact in the case of the output electrode when a channel is formed.

The nanotube switching elements 100 may be used to create larger circuits such as Boolean logic circuits. For example, a resistive load may be used on the output node 102 to form an inverter (not shown). Alternatively, the switching devices 100 may also be used as a form of complementary logic, in which the switches 100 are used as "loads" or pull-up devices. Complementary logic formed using switches 100 will not conduct DC current between power supply and ground.

For example, as will be explained below, NOR and NOT circuits may be built using the nanotube switching elements. Each of these Boolean functions includes an inversion aspect, e.g., inverting the logic value of the input in the case of NOT function. NORs and NOTs (and NANDs) provide a fundamental building block from which any Boolean function may be created and enable the creation of an entire logic family.

FIGS. 9–11C show the layout and operation of an exemplary inverter circuit. FIGS. 12A–16C show the layout and operation of an exemplary NOR circuit.

FIG. 9A shows an inverter circuit 900 of a preferred embodiment. The circuit 900 implements a Boolean NOT functional transformation of the input signal received on terminal A and produces the output on terminal O. The circuit is depicted logically in FIG. 9B, and its truth table description of operation is provided in FIG. 9C.

As shown in the layout view of FIG. 9A, the circuit 900 includes two nanotube switching elements 902 and 904. These switching elements are similar to those of FIG. 3 or 5 in that each includes two signal electrodes, as shown. An input signal is received on input terminal A, which is connected via trace 906 to respective control electrodes of nanotube switching elements 902 and 904. The signal electrode of nanotube switching element 902 is tied to reference signal Vdd, and the signal electrode of nanotube switching element 904 is tied to reference signal ground. (Notice that these switching elements have the reference signals connected to signal electrodes that are nearer the output electrode, but the reference signals could alternatively, or in addition, be connected to the other signal electrode of the switching element.) The output electrode of each output node is tied together (as described previously) and as depicted with the 'X' notation in the figure. The output node of each of the nanotube switching elements 902 and 904 is tied to the other output node via trace 908 which is also connected to output terminal O.

Figure 10B:
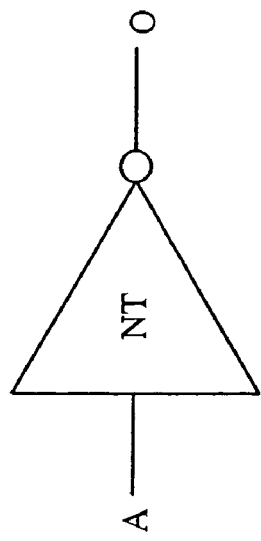
Figure 10C:
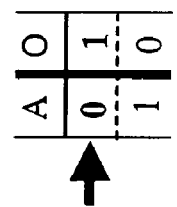
Figure 10A:
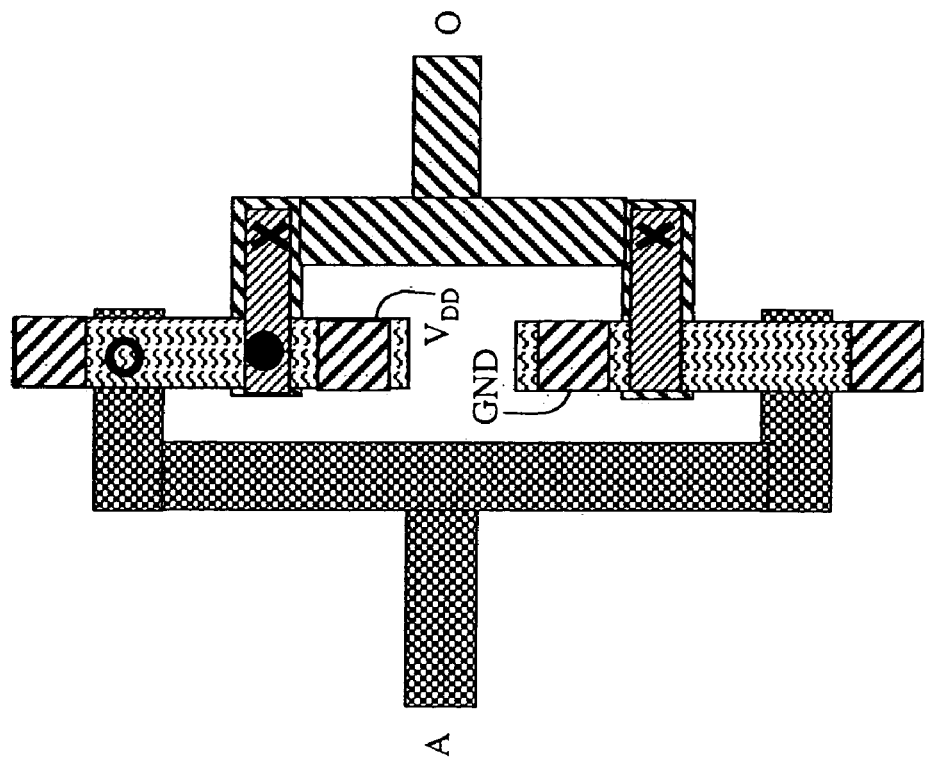

FIGS. 10A–C depict the operation of circuit 900 when the input terminal has a logically false or 0 value which in this arrangement corresponds to a signal substantially equal to ground. (Notice the arrow of FIG. 10C identifying which row of the truth table is being depicted.) As can be seen in the figure, the nanotube switching element 902 has a logical 0 on the control electrode and Vdd on the signal electrode. The thick lined, but empty circle shown on the control node of switching element 902 is used to depict that the control electrode has activated the channel formation, and that the nanotube channel is in mechanical (but not electrical) contact with the control electrode. The filled circle shown on the output electrode (over the area having the nanotube channel element) is used to depict that the nanotube channel element is in mechanical and electrical contact with an output electrode. The 'X' notation is again used to show that elements are tied together. As explained before in connection with the description of the switching element of FIGS. 1A–B, having a ground on the control electrode and Vdd on the signal electrode creates electrostatic forces to cause the channel element to form a channel with the output electrode. This channel formation is shown via thick lined, but empty circle shown on the control node and the filled circle shown on the output electrode. Because the channel is formed, the signal Vdd on the signal electrode can be transferred (via the channel) to the output node and in turn to the trace 908 and the output terminal O. On the other hand the nanotube switching element 904 has a logical 0 on the control node and ground on the signal electrode. No electrostatic forces are generated to form the channel for that switching element and consequently no channel is formed and the output node of element 904 floats. In this instance, the output node is at Vdd because of the operation of switching element 902. Even though the output node of switching element 904 is at Vdd and the channel element is at logical 0, the channel element is not deflected because of the operation of the isolation structure described previously; that is, the floating output does not cause the deflection of the nanotube channel element of switching element 904.

Figure 11B:
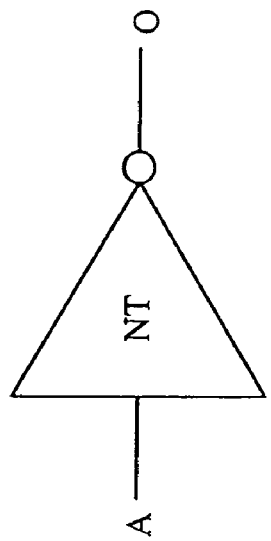
Figure 11C:
Figure 11A:
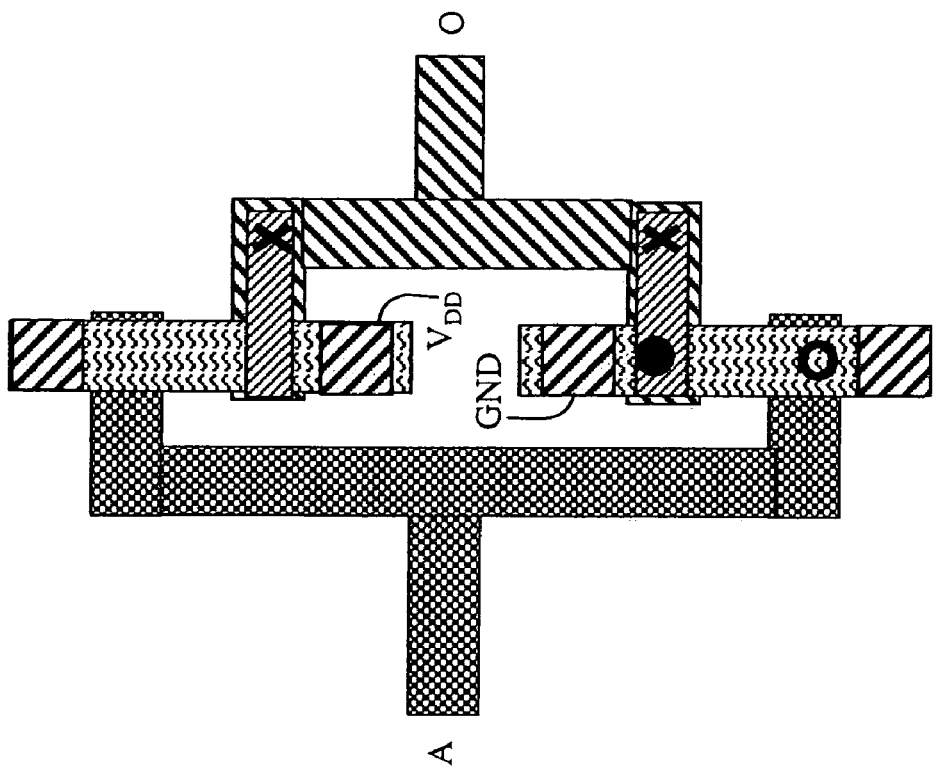
Figures 14A, 14B, 14C:
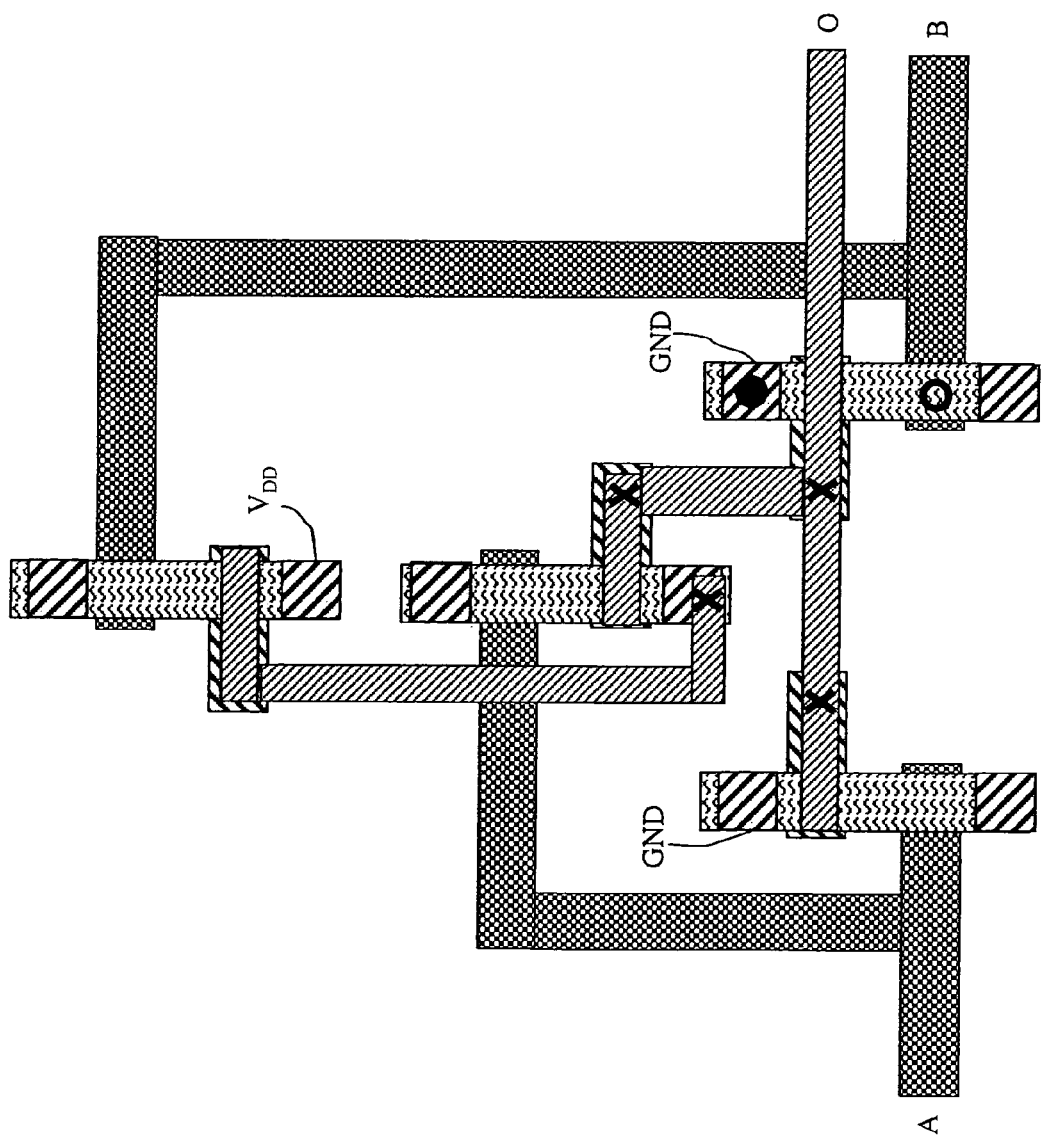

FIGS. 11A–C depict the operation of circuit 900 when the input terminal has a logically true or 1 value. The operation is analogous to that above. In this instance the switching element 902 floats, and the element 904 forms a channel. The channel causes the signal on the signal electrode (ground) to transfer to the output node and in turn to the trace 908 and the output terminal O.

FIG. 12A shows a NOR circuit 1200 of a preferred embodiment. The circuit 1200 implements a Boolean NOR functional transformation of the input signals received on terminals A and B and produces the output on terminal O. The circuit is depicted logically in FIG. 12B, and its truth table description of operation is provided in FIG. 12C.

As shown in the layout view of FIG. 12A, the circuit 1200 includes four nanotube switching elements 1202, 1204, 1206, and 1208. The signal electrodes are connected as labeled to Vdd and ground. Notice in this example that the signal electrode of switching element 1204 is connected to the output electrode of element 1202.

FIGS. 13A through 16A iterate through the various combinations of input signals, i.e., rows of the truth table. They use the same notation including filled circles to show electrical and mechanical contact and thick line unfilled circles to show mechanical (but not electrical) contact used before in connection with the inverter (or NOT) circuit. Each figure therefore shows when a given channel has been activated (thick lined, unfilled circle) and when a channel is formed to the output (filled circle). Thus one can determine which switching element has a channel formed and which has a floating channel from direct inspection of the figures to see how the circuit operates for all input combinations.

Figure 17A:
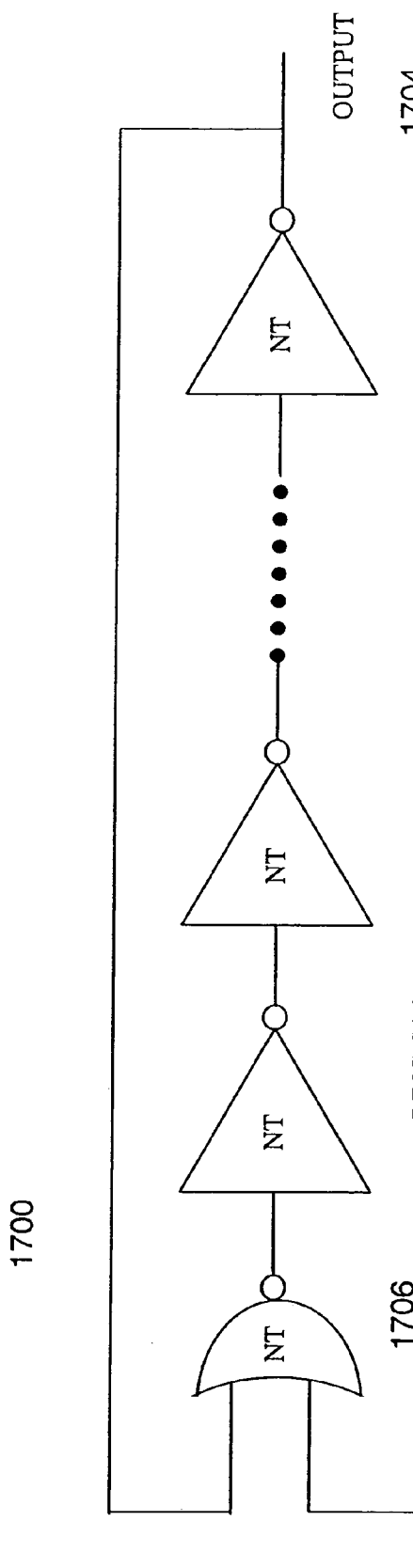
FIGS. 17A and 17B illustrate a ring oscillator according to certain embodiments.
Figure 17B:
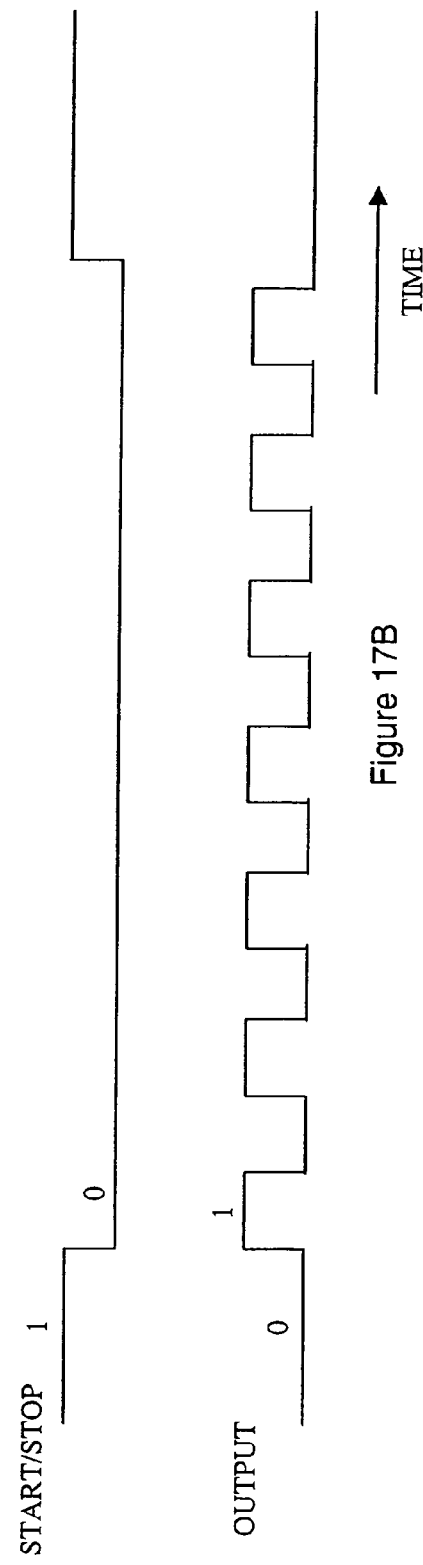

FIGS. 17A and 17B illustrate a ring oscillator 1700. Thousands of ring oscillators over a chip area may be used to test and characterize a technology—a great line monitor. Such ring oscillators with varying nanotube fabric structures can be used to debug a CMOS process that uses nanotube fabrics. The ring oscillator line monitor gives the performance of nanotube fabrics, impacts of nanotube fabrics due to the integrated circuit process. It can characterize the performance of a logic family as well. The oscillator is triggered by a start/stop input 1702 and the output 1704 is monitored. When the start/stop voltage goes from high to low, the output oscillates, as shown in FIG. 17B. These oscillations are monitored. When the start/stop input goes to a high voltage, the oscillations stop. These line monitors can be used to monitor the voltage output levels, speed, power supply voltage sensitivity, etc. as a function of temperature, number of cycles, etc. Ring oscillators can be packaged and subjected to aggressive environments tests and monitored while operating. It can be tested in other harsh environments.

A ring oscillator using an odd number of stages is shown in FIGS. 17A and 17B. The input stage 1706 is a two input NOR, all other stages are inverters. In preferred embodiments, the ring oscillator is formed using nanotube switching elements in complimentary form, as described above in connection with the NOT and NOR circuits of FIGS. 9 and 12. Tabs at each (or select) circuit stages can be used to probe individual stages for failure analysis purposes. The ring oscillator can be tapped at more than one point to switch a non-volatile storage nanotube-based device ON to OFF and OFF to ON as a stress test. The ring oscillator excercises nanotube-based devices. The nanotube-based logic family excels in harsh environments. There are no semiconductor junctions, hence leakage is much lower than for transistors, diodes, etc. The nanotube-based logic can be used in burn-in and other harsh chambers to monitor the performance of devices, such as FETs and bipolar devices that fail after extended exposure to harsh environments.

The nanotube switching elements may be designed to ensure that channel formation is broken faster than channel formation is formed. In this fashion, inverter circuits and the like may be operated to reduce shoot through current for the temporary time when both switching elements might otherwise have channels formed. One way to address this is to size the device so that the electrical contact release forces are greater than the forces for channel formation.

The nanofabric switching elements of certain embodiments are generally volatile switches, i.e., after contacting an electrode, the nanofabric does not stay in contact with that contacted electrode when electrical stimulus is interrupted.

Under some embodiments, the nanotube-based switching elements may be constructed physically over existing bipolar and MOS electronic devices to integrate nanotube logic with existing electronic circuitry. Other embodiments create digital logic on substrates other than silicon to integrate digital logic circuits in objects not suited to conventional digital circuit integration. Some embodiments do not necessarily draw DC current and may only dissipate power when they switch.

A nanofabric or ribbon has been shown to substantially conform to a surface, such as a surface of an article on a semiconductor substrate. A fabric of nanotubes may be constructed by any appropriate means, including, but not limited to spin coating, direct growth on a suitable substrate or other application. The fabric will be horizontally oriented when the surface of the substrate that receives the fabric is horizontally oriented. The present inventors have appreciated that devices such as electromechanical switches can be constructed using nanofabrics which have conformed to a surface which is substantially perpendicular to a semiconductor substrate (vertically-oriented) and that such devices can be used as vertically oriented switches in a plethora of applications. Fabrication techniques to develop such horizontally- and vertically-disposed fabrics and devices composed of nanotube fabrics which comprise redundant conducting nanotubes may be created via CVD, or by room temperature operations as described herein and described in the patent references incorporated herein. Such fabrication techniques include the ability to form said switches for use in many different articles having relatively short spans of suspended nanofabric articles. In some embodiments, this allows smaller device dimensions and higher strains in the nanofabric articles, as well as lower electrical resistances. Such articles may be adapted or modified to perform logic functions or be part of a scheme involving logical functionality.

While the nanotube switching element 100 is shown with a lateral (horizontal) orientation, the device may also be fabricated with a vertical orientation, such as on a sidewall of a trench structure. Also, the device may be at any angle, such as forty-five degrees, for example.

While the nanotube switching element 100 is describe with the electrodes 102a,b electrically connected, in other embodiments the electrodes may be unconnected and at different voltages (i.e., separately driven to sufficient voltages—perhaps with different control). Also, the control electrode 101 may be above the nanotube device instead of below the nanotube. And the channel may transfer signals to an output node other than through mechanical and electrical contact, e.g., capacitive coupling.

The inventors expect this logic to be lower power than CMOS, much less leaky, extreme environment tolerant, etc. It is also very robust because there is no increased leakage with temperature, making it very useful in hot or cold environments such as the heat of engines, etc., as well in ordinary electronics whose operating temperatures meets or exceeds the specifications of the current state of the art electronics capabilities. The nanotube-based logic can be incorporated into a line of products that do not use transistors.

The devices and articles shown in the preceding embodiments are given for illustrative purposes only, and other techniques may be used to produce the same or equivalents thereof. Furthermore, the articles shown may be substituted with other types of materials and geometries in yet other embodiments. For example, rather than using metallic electrodes, some embodiments of the present invention may employ nanotubes. In fact, devices comprising nanotube and nanofabric articles in place of the electrodes shown above can be constructed as well.

The inventors envision additional configurations of volatile and nonvolatile or mixed nanoelectromechanical designs depending upon the specific application, speed, power requirements and density desired. Additionally the inventors foresee the use of multiwalled carbon nanotubes, nanowires, or mixtures of single-walled carbon nanotubes and nanowires as the switching element of contact points within the switch. As the technology node decreases in size from 90 nm to 65 nm and below down to the size of individual nanotubes or nanowires the inventors foresee adapting the basic electromechanical switching elements and their operation to a generation of nanoscale devices with scaleable performance characteristics concomitant with such size reduction.

The material used in the fabrication of the electrodes and contacts used in the nanotube switches is dependent upon the specific application, i.e. there is no specific metal necessary for the operation of the present invention.

Nanotubes can be functionalized with planar conjugated hydrocarbons such as pyrenes which may then aid in enhancing the internal adhesion between nanotubes within the ribbons. The surface of the nanotubes can be derivatized to create a more hydrophobic or hydrophilic environment to promote better adhesion of the nanotube fabric to the underlying electrode surface. Specifically, functionalization of a wafer/substrate surface involves "derivitizing" the surface of the substrate. For example, one could chemically convert a hydrophilic to hydrophobic state or provide functional groups such as amines, carboxylic acids, thiols or sulphonates to alter the surface characteristics of the substrate. Functionalization may include the optional primary step of oxidizing or ashing the substrate in oxygen plasma to remove carbon and other impurities from the substrate surface and to provide a uniformly reactive, oxidized surface which is then reacted with a silane. One such polymer that may be used is 3-aminopropyltriethoxysilane (APTS). The substrate surface may be derivitized prior to application of a nanotube fabric.

While single walled carbon nanotubes are preferred, multi-walled carbon nanotubes may be used. Also nanotubes may be used in conjunction with nanowires. Nanowires as mentioned herein is meant to mean single nanowires, aggregates of non-woven nanowires, nanoclusters, nanowires entangled with nanotubes comprising a nanofabric, mattes of nanowires, etc. The invention relates to the generation of nanoscopic conductive elements used for any electronic application.

The following patent reference refer to various techniques for creating nanotube fabric articles and switches and are assigned to the assignee of this application. Each is hereby incorporated by reference in their entirety.

U.S. patent application Ser. No. 10/341,005, filed on Jan. 13, 2003, entitled Methods of Making Carbon Nanotube Films, Layers, Fabrics, Ribbons, Elements and Articles;

U.S. patent application Ser. No. 09/915,093, filed on Jul. 25, 2001, entitled Electromechanical Memory Array Using Nanotube Ribbons and Method for Making Same;

U.S. patent application Ser. No. 10/033,032, filed on Dec. 28, 2001, entitled Methods of Making Electromechanical Three-Trace Junction Devices;

U.S. patent application Ser. No. 10/033,323, filed on Dec. 28, 2001, entitled Electromechanical Three-Trace Junction Devices;

U.S. patent application Ser. No. 10/128,117, filed on Apr. 23, 2002, entitled Methods of NT Films and Articles;

U.S. patent application Ser. No. 10/341,055, filed Jan. 13, 2003, entitled Methods of Using Thin Metal Layers to Make Carbon Nanotube Films, Layers, Fabrics, Ribbons, Elements and Articles;

U.S. patent application Ser. No. 10/341,054, filed Jan. 13, 2003, entitled Methods of Using Pre-formed Nanotubes to Make Carbon Nanotube Films, Layers, Fabrics, Ribbons, Elements and Articles;

U.S. patent application Ser. No. 10/341,130, filed Jan. 13, 2003, entitled Carbon Nanotube Films, Layers, Fabrics, Ribbons, Elements and Articles;

U.S. patent application Ser. No. 10/776,059, filed Feb. 11, 2004, entitled Devices Having Horizontally-Disposed Nanofabric Articles and Methods of Making The Same; and U.S. patent application Ser. No. 10/776,572, filed Feb. 11, 2004, entitled Devices Having Vertically-Disposed Nanofabric Articles and Methods of Making the Same.

The invention may be embodied in other specific forms without departing from the spirit or essential characteristics thereof. The present embodiments are therefore to be considered in respects as illustrative and not restrictive, the scope of the invention being indicated by the appended claims rather than by the foregoing description, and all changes which come within the meaning and range of the equivalency of the claims are therefore intended to be embraced therein.

What is claimed is:

1. A Boolean logic circuit, comprising:
at least one input terminal and an output terminal;
a network of nanotube switching elements electrically disposed between said at least one input terminal and said output terminal;
said network of nanotube switching elements effectuating a Boolean NOT function transformation of Boolean signals on said at least one input terminal, said Boolean function transformation including a Boolean inversion within the function;
wherein said network of nanotube switching elements includes a first and a second nanotube switching element, each nanotube switching element including:
an output node;
a nanotube channel element having at least one electrically conductive nanotube; and
a control electrode disposed in relation to the nanotube channel element to controllably form an electrically conductive channel to the output node;
wherein the at least one input terminal of the Boolean logic circuit is in electrical communication with the control electrodes of the first and second nanotube switching elements;
wherein the output nodes of the first and second nanotube switching elements are electrically coupled together and to the output terminal of the Boolean logic circuit;
wherein the nanotube channel element of the first nanotube switching element is in electrical communication with a logical true value, and the nanotube channel element of the second nanotube switching element is in electrical communication with a logical false value.

2. The Boolean logic circuit of claim 1 wherein channel formation of each of the first and second nanotube switching elements is caused by electromechanical deflection of said nanotube channel element to cause contact between said nanotube channel element and said output node.

3. The Boolean logic circuit of claim 2 wherein said nanotube channel element is deflectable in response to electrostatic forces caused by the relationship of signals on the nanotube channel element and on the control electrode, and wherein each of the first and second nanotube switching elements includes an isolation structure disposed in relation to the nanotube channel element so that channel formation is substantially invariant from the state of the output node.

4. The Boolean logic circuit of claim 3 wherein said isolation structure includes electrodes disposed on opposite sides of the nanotube switching element and which are in low resistance electrical communication with one another.

5. The Boolean logic circuit of claim 1 wherein said nanotube channel element is position in spaced and crossed relation relative to the control electrode and wherein deflection of said nanotube channel element is in response to electrostatic forces resulting from signals on the nanotube channel element and on the control electrode.

6. The Boolean logic circuit of claim 1 wherein said nanotube channel element is lithographically-defined.

7. The Boolean logic circuit of claim 1 wherein said nanotube switching element is constructed from nanofabric.

8. The Boolean logic circuit of claim 3 wherein said control electrode is covered with an insulator.

9. The Boolean logic circuit of claim 3 wherein each nanotube channel element is positionable into one of at least two positional states in response to the relationship of signals on the nanotube channel element and the control electrode, wherein one of at least two positional states is defined by the nanotube channel element being in a floating state, not in electrical communication with said output node.

10. A Boolean logic circuit, comprising:
at least first and second input terminals and an output terminal;
a network of nanotube switching elements electrically disposed between said at least first and second input terminals and said output terminal;
said network of nanotube switching elements effectuating a Boolean NOR function transformation of Boolean signals on said at least first and second input terminals, said Boolean function transformation including a Boolean inversion within the function, wherein said network of nanotube switching elements includes a first, a second, a third and a fourth nanotube switching element, each nanotube switching element including:
an output node;
a nanotube channel element having at least one electrically conductive nanotube; and
a control electrode disposed in relation to the nanotube channel element to controllably form an electrically conductive channel to the output node;
wherein the first input terminal of the Boolean logic circuit is in electrical communication with the control electrodes of the first and the third nanotube switching elements, and the second input terminal of the Boolean logic circuit is in electrical communication with the control electrodes of the second and the fourth nanotube switching elements;
wherein the output node of the second nanotube switching element is electrically coupled to the nanotube channel element of the first nanotube switching element;
wherein the output node of the first nanotube switching element is electrically coupled to the output nodes of the third and fourth nanotube switching elements and to the output terminal of the Boolean logic circuit;
wherein the nanotube channel element of the second nanotube switching element is in electrical communication with a logical true value, and the nanotube channel elements of the third and fourth nanotube switching elements are in electrical communication with a logical false value.

11. The Boolean logic circuit of claim 10 wherein channel formation of the first, second, third and fourth nanotube switching elements is caused by electromechanical deflection of said nanotube channel element to cause contact between said nanotube channel element and said output node.

12. The Boolean logic circuit of claim 11 wherein said nanotube channel element is deflectable in response to electrostatic forces caused by the relationship of signals on the nanotube channel element and on the control electrode, and wherein each of the first, second, third and fourth nanotube switching elements includes an isolation structure disposed in relation to the nanotube channel element so that channel formation is substantially invariant from the state of the output node.

13. The Boolean logic circuit of claim 12 wherein said isolation structure includes electrodes disposed on opposite sides of the nanotube switching element and which are in low resistance electrical communication with one another.

14. The Boolean logic circuit of claim 10 wherein said nanotube channel element is position in spaced and crossed relation relative to the control electrode and wherein deflection of said nanotube channel element is in response to electrostatic attractive forces resulting from signals on the nanotube channel element and on the control electrode.

15. The Boolean logic circuit of claim 10 wherein said nanotube channel element is lithographically-defined.

16. The Boolean logic circuit of claim 10 wherein said nanotube switching element is constructed from nanofabric.

17. The Boolean logic circuit of claim 12 wherein said control electrode is covered with an insulator.

18. The Boolean logic circuit of claim 12 wherein each nanotube channel element is positionable into one of at least two positional states in response to the relationship of signals on the nanotube channel element and the control electrode, wherein one of at least two positional states is defined by the nanotube channel element being in a floating state, not in electrical communication with said output node.

* * * * *